(12) United States Patent
Jeong et al.

(10) Patent No.: US 7,719,000 B2
(45) Date of Patent: May 18, 2010

(54) ORGANIC SEMICONDUCTOR MATERIALS USING STACKING-INDUCING COMPOUNDS, COMPOSITIONS COMPRISING SUCH MATERIALS, ORGANIC SEMICONDUCTOR THIN FILMS FORMED USING SUCH COMPOSITIONS, AND ORGANIC ELECTRONIC DEVICES INCORPORATING SUCH THIN FILMS

(75) Inventors: Eun Jeong Jeong, Senongnam-si (KR); Bang Lin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 461 days.

(21) Appl. No.: 11/700,028

(22) Filed: Jan. 31, 2007

(65) Prior Publication Data
US 2007/0287220 A1    Dec. 13, 2007

(30) Foreign Application Priority Data
Jun. 7, 2006    (KR) ...................... 10-2006-0050943

(51) Int. Cl.
*H01L 35/24* (2006.01)
*H01L 51/00* (2006.01)
(52) U.S. Cl. ................................. 257/40; 257/E51.028
(58) Field of Classification Search .................... 257/40
See application file for complete search history.

(56) References Cited

U.S. PATENT DOCUMENTS

| | | | | |
|---|---|---|---|---|
| 5,346,772 | A * | 9/1994 | Akiyama et al. | 428/457 |
| 2004/0067387 | A1 * | 4/2004 | Kim et al. | 428/690 |
| 2006/0292758 | A1 * | 12/2006 | Jeong et al. | 438/149 |

\* cited by examiner

*Primary Examiner*—Kenneth A Parker
*Assistant Examiner*—Anthony Ho
(74) *Attorney, Agent, or Firm*—Harness, Dickey & Pierce, P.L.C.

(57) ABSTRACT

Disclosed are organic semiconductor materials, including mixtures of relatively low molecular weight aromatic ring compounds, in which at least one nitrogen atom or oxygen atom is present as a heteroatom in the aromatic ring compounds for forming hydrogen bonds between the heteroatom(s) and adjacent molecules and thereby increase intermolecular stacking. Organic semiconductor layers formed using such organic semiconductor materials will, accordingly, exhibit increased intermolecular stacking and associated improvements in one or more electrical properties of the semiconductor layer. Organic thin film transistors incorporating such organic semiconductor layers will tend to exhibit improved transistor properties including, for example, increased carrier mobility and reduced off-state leakage current. Further, the organic semiconductor layers may be manufactured using conventional room temperature processes, for example, spin coating or printing, thereby simplifying the fabrication process.

20 Claims, 2 Drawing Sheets

ORGANIC SEMICONDUCTOR MATERIALS USING STACKING-INDUCING COMPOUNDS, COMPOSITIONS COMPRISING SUCH MATERIALS, ORGANIC SEMICONDUCTOR THIN FILMS FORMED USING SUCH COMPOSITIONS, AND ORGANIC ELECTRONIC DEVICES INCORPORATING SUCH THIN FILMS

PRIORITY STATEMENT

This non-provisional application claims priority under U.S.C. §119(a) from Korean Patent Application No. 2006-50943, which was filed on Jun. 7, 2006, in the Korean Patent Office and which is incorporated herein, in its entirety, by reference.

BACKGROUND

1. Field of Endeavor

The example embodiments generally relate to organic semiconductor materials including at least one stacking-inducing compound, compositions comprising such materials, organic semiconductor thin films formed using at least one of the compositions, and organic electronic devices, for example, organic thin film transistors (OTFT), incorporating at least one of the thin films. More particularly, example embodiments include organic semiconductor materials comprising a mixture of low-molecular-weight aromatic ring compounds in which at least one heteroatom, for example, nitrogen or oxygen, is present in the molecules and in a position whereby the heteroatom(s) can form bonds with a hydrogen atom of an adjacent molecule, the hydrogen bond being of sufficient strength to induce intermolecular stacking, and to applications thereof.

2. Description of the Related Art

After the development of polyacetylene, a conjugated organic polymer having semiconductor properties, interest in organic semiconductors and their potential for use as electric and electronic materials has increased Organic semiconducting materials may provide certain advantages over conventional inorganic semiconductor materials including for example, various synthesis methods, easy formability into fibers or films, improved flexibility, improved conductivity, and/or reduced fabrication costs. In light of these potential advantages, research and study efforts in the field of functional electronic devices and optical devices incorporating such materials has been increasing.

Compared to conventional silicon thin film transistors, OTFTs may provide advantages in that semiconductor layers may be formed using atmospheric pressure wet processes and thereby avoid the need for the conventional plasma-enhanced chemical vapor deposition (PECVD) processes. In addition, the fabrication processes may be carried out using roll-to-roll processes and may utilize plastic substrates, if suitable or necessary for the intended application, thereby decreasing the cost of fabricating the semiconductor device. OTFTs may be suitable for use in a number of applications including, for example, display drivers for active displays, smart cards, plastic chips for inventory control, for example, RFID tags.

However, in conventional methods of fabricating OTFTs in which the thin film is formed using a room-temperature wet process, the resulting thin film does not tend to exhibit a highly ordered structure relative to conventional inorganic semiconductor materials. To the extent that the organic thin films exhibit reduced intermolecular ordering, this less ordered structure tends to result in undesirable effects including, for example, decreased charge mobility and/or increased off-state leakage current that may render such films unsuitable for use in various applications.

Conventional attempts to address these issues have included various methods of treating an insulator with a surface treatment agent that is interchangeable with a semiconductor material. However, such methods tend to introduce additional issues including, for example, increased manufacturing costs and/or more complicated fabrication procedures, and does not tend to with the use of additional material, and also has a complicated procedure and does not realize the desired effects.

SUMMARY

Example embodiments encompass organic semiconductor materials suitable for use in room-temperature wet processes for forming organic semiconductor films that exhibit increased intermolecular stacking. Example embodiments also encompass compositions comprising at least one such organic semiconductor material, organic thin films formed from such compositions and semiconductor devices including such films. Example embodiments also encompass methods of forming such compositions, methods of forming such thin films and methods of forming such semiconductor devices. The use of such compositions and the incorporation of such films in organic semiconductor devices can provide organic semiconductor thin films that may exhibit improved intermolecular packing densities and organic electronic devices that may exhibit improved charge mobility and/or reduced off-state leakage current, thereby rendering such devices suitable for an increased range of applications.

Example embodiments of the organic semiconductor materials include mixtures of an aromatic ring compound that may be represented by Formula I, illustrated below, and an aromatic ring compound that may be represented by Formula II, illustrated below:

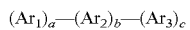   Formula I wherein $Ar_1$, $Ar_2$ and $Ar_3$ are each independently selected from a group consisting of substituted and unsubstituted C6-C30 aryl groups and substituted and unsubstituted C2-C30 heteroaryl groups, wherein at least one of $Ar_1$, $Ar_2$, and $Ar_3$ is substituted with a heteroatom selected from a group consisting of nitrogen and oxygen, and further wherein a, b and c are each independently selected from integers from 0 to 20 and wherein $(a+b+c\neq 0)$; and

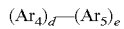   Formula II wherein $Ar_4$ and $Ar_5$ are each independently selected from a group consisting of substituted and unsubstituted C6-C30 aryl groups and substituted and unsubstituted C2-C30 heteroaryl groups, wherein at least one of the carbon ring atoms of at least one of $Ar_4$ and $Ar_5$ is substituted with nitrogen or oxygen or at least one of the hydrogen atoms of at least one of $Ar_4$ and $Ar_5$ is substituted with a substituent selected from a group consisting of amine groups and a hydroxyl group, and further wherein d and e are each independently selected from integers from 0 to 10 and wherein $(d+e\neq 0)$.

Example embodiments of the compositions include a mixture of aromatic ring compounds according to Formula I and Formula II in combination with an appropriate solvent, typically an organic solvent or a combination of organic solvents. As will be appreciated by those skilled in the art, the organic semiconductor materials, the solvent(s) and/or other components of the composition may be selected and/or adjusted to produce compositions exhibiting a range of properties including, for instance, viscosity, contact angle and solids content, thereby allowing the composition to be adapted for a variety of application techniques and processes. Example embodiments of the organic semiconductor thin films fabricated from the compositions tend to exhibit improved intermolecular packing densities and organic electronic devices that incorporate such organic semiconductor thin films may exhibit improved charge mobility and/or reduced off-state leakage current.

BRIEF DESCRIPTION OF THE DRAWINGS

Example embodiments of the organic semiconductor materials, organic semiconductor layers formed from such materials, organic semiconductor devices incorporating such organic semiconductor layers and the performance of such organic semiconductor devices are addressed more fully below with reference to the attached drawings in which.

Figure 1:
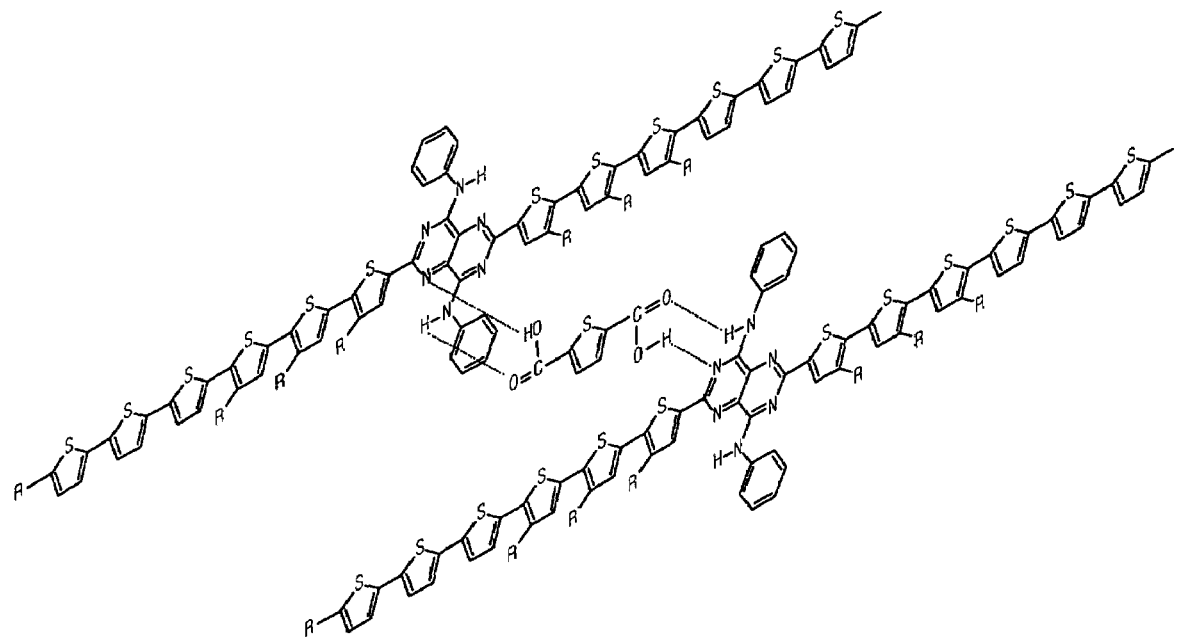
FIG. 1 illustrates an example embodiment of an organic semiconductor material in which H-bonds are formed between the aromatic ring compounds present in the organic semiconductor material.

It should be noted that these Figures are intended to illustrate the general characteristics of organic semiconductor compounds and semiconductor device structures according to example embodiments in order to supplement the written description provided below. These drawings, however, are not necessarily to scale and may not precisely reflect the characteristics of any given embodiment, and should not be interpreted as defining or limiting the range of values or properties of embodiments within the scope of the disclosure. In particular, the relative positioning and sizing of atoms, bonds, layers or regions may be reduced or exaggerated for clarity.

DESCRIPTION OF EXAMPLE EMBODIMENTS

Example embodiments of the organic semiconductor materials include mixtures of an aromatic ring compound that may be represented by Formula I, illustrated below, and an aromatic ring compound that may be represented by Formula II, illustrated below:

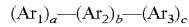  Formula I wherein $Ar_1$, $Ar_2$ and $Ar_3$ are each independently selected from a group consisting of substituted and unsubstituted C6-C30 aryl groups and substituted and unsubstituted C2-C30 heteroaryl groups, wherein at least one of $Ar_1$, $Ar_2$, and $Ar_3$ is substituted with a heteroatom selected from a group consisting of nitrogen and oxygen, and further wherein a, b and c are each independently selected from integers from 0 to 20 and wherein $(a+b+c\neq 0)$; and

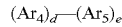  Formula II wherein $Ar_4$ and $Ar_5$ are each independently selected from a group consisting of substituted and unsubstituted C6-C30 aryl groups and substituted and unsubstituted C2-C30 heteroaryl groups, wherein at least one of the carbon ring atoms of at least one of $Ar_4$ and $Ar_5$ is substituted with nitrogen or oxygen or at least one of the hydrogen atoms of at least one of $Ar_4$ and $Ar_5$ is substituted with a substituent selected from a group consisting of amine groups and a hydroxyl group, and further wherein d and e are each independently selected from integers from 0 to 10 and wherein $(d+e\neq 0)$.

As noted above, at least at least one carbon ring atom of at least one of $Ar_1$, $Ar_2$, and $Ar_3$ may be substituted with nitrogen or oxygen, or at least one of the hydrogen atoms thereof may be substituted with a substituent selected from the group consisting of —OH, —$NR_aR_b$, —$CONR_aR_b$, —$COR_c$, —$COOR_d$ (wherein $R_a$ and $R_b$ are each independently selected from a group consisting of hydrogen, C1-C30 alkyl groups, C6-C30 aryl groups and C2-C30 heteroaryl groups, $R_c$ is selected from a group consisting of hydrogen, a hydroxyl group, halogens, C1-C30 alkyl groups, C6-C30 aryl groups and C2-C30 heteroaryl groups, and $R_d$ is selected from a group consisting of C1-C30 alkyl groups, C6-C30 aryl groups, C2-C30 heteroaryl groups (including nitrogen or oxygen as a heteroatom)), C1-C30 hydroxyalkyl groups and C2-C30 heteroaryl groups (including nitrogen or oxygen as a heteroatom).

Example embodiments of the organic semiconductor materials comprise mixtures of low-molecular-weight aromatic ring compounds, each of which contains at least one nitrogen atom or oxygen atom. The heteroatom(s), i.e., oxygen and/or nitrogen atoms, contained in the aromatic ring compounds according to Formula I and Formula II, function as H-bond acceptors and/or as an H-bond donor between the molecules or within the molecule, thereby allowing the formation of strong H-bonds between nitrogen and hydrogen (e.g., between a non-shared electron pair from N and —NH or —OH) and between oxygen and hydrogen (e.g., between C=O and —NH or —OH) that, in turn, induces increased intermolecular stacking of the molecules.

FIG. 1 illustrates H-bonds formed between example embodiments of the aromatic ring compounds used to form the organic semiconductor material. As shown in FIG. 1, the nitrogen ring atom of a pyrimidopyrimidine oligothiophene derivative, a compound according to Formula I, may form a strong H-bond with the —OH of thiophene carboxylic acid, a compound according to Formula II. In addition, the N—H of the pyrimidopyrimidine oligothiophene derivative may form a strong H-bond with C=O of thiophene carboxylic acid. The formation of the H-bonds will, in turn, induce stacking of the two molecules.

Therefore, when example embodiments of the organic semiconductor material comprising such a mixture of aromatic ring compounds according to Formulas I and II are applied to actual devices, the packing density between the molecules will tend to increase and will tend to produce a semiconductor thin film that exhibits improved electrical properties, for example, increased charge mobility and reduced off-state leakage current, relative to conventional organic semiconductor materials. Further, because the molecular weights of the aromatic ring compounds are relatively low and the compounds typically include an alkyl group and/or a hydroxyalkyl group as a substituent, the compounds tend to be readily soluble in a range of organic solvents and may, therefore, be incorporated in compositions for application to substrates using conventional wet processing techniques at room temperature and atmospheric pressure.

Specifically, in Formulas I and II, each of the aryl group or heteroaryl group may be selected from the compounds illustrated in Groups I and II, with thiophene groups, phenyl groups, pyrrole groups, pyridine groups, pyrimidine groups and pyrimidopyrimidine groups expected to be of particular utility:

Group I:

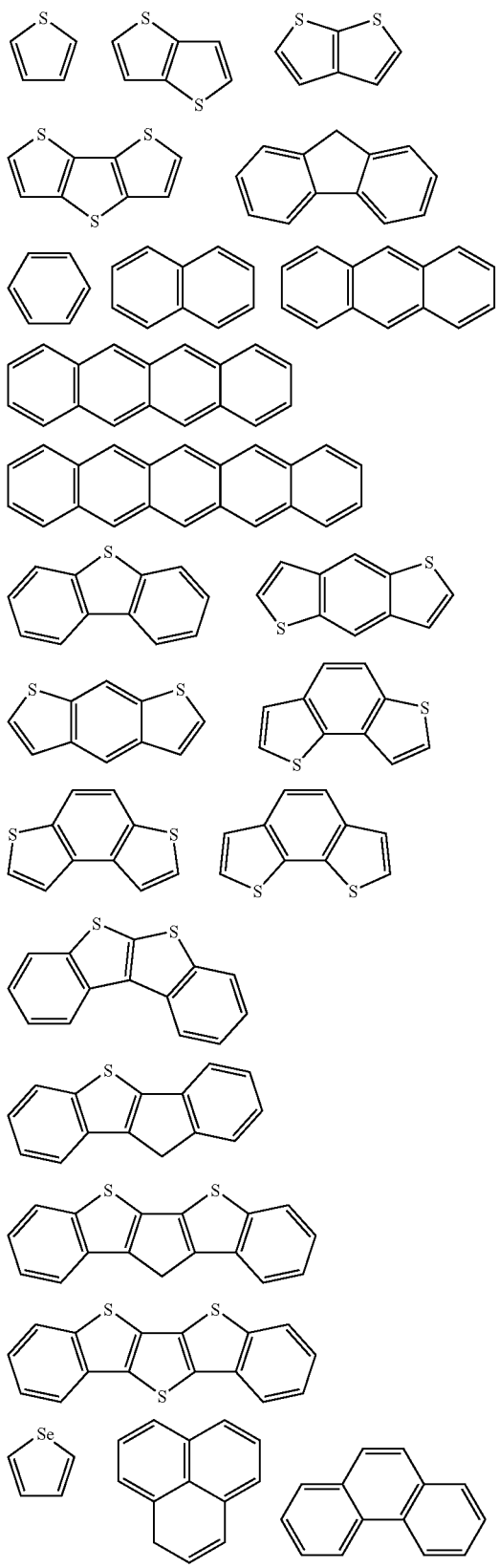

Group II:

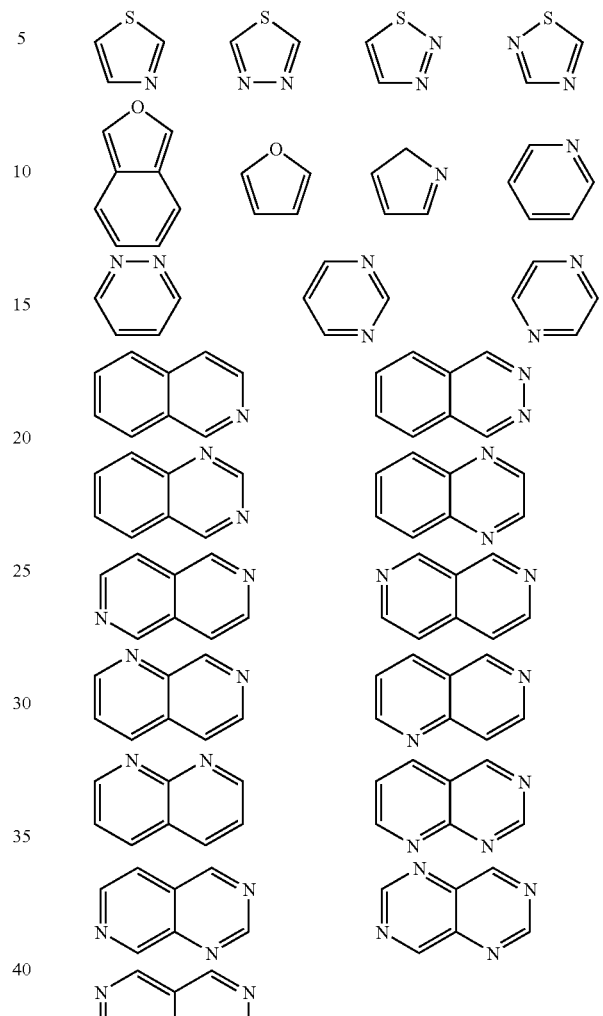

In addition, the range of substituents which may be substituted in the aryl group or heteroaryl group is not particularly limited, but may, for example, include at least one substituent selected from the group consisting of —OH, —NR$_a$R$_b$, —CONR$_a$R$_b$, —COR$_c$, —COOR$_d$ (wherein R$_a$ and R$_b$ are each independently selected from a group consisting of hydrogen, C1-C30 alkyl groups, C6-C30 aryl groups and C2-C30 heteroaryl groups, R$_c$ is selected from a group consisting of hydrogen, a hydroxyl group, halogens, C1-C30 alkyl groups, C6-C30 aryl groups and C2-C30 heteroaryl groups (including nitrogen and/or oxygen as a heteroatom), and R$_d$ is selected from a group consisting of C1-C30 alkyl groups, C6-C30 aryl groups and C2-C30 heteroaryl groups (including nitrogen and/or oxygen as a heteroatom)), C1-C30 hydroxyalkyl groups, C2-C30 heteroaryl groups (including nitrogen and/or oxygen as a heteroatom), halogens, a nitro group (—NO$_2$), a cyano group (—C≡N), C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

More specifically, the aromatic ring compound of Formula I is not particularly limited, but may be exemplified by compounds represented by Formulas III to XI as illustrated below:

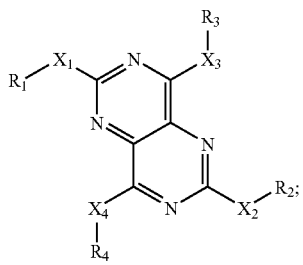
Formula III

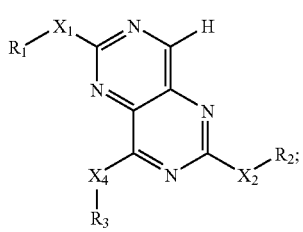
Formula IV

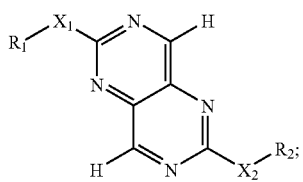
Formula V

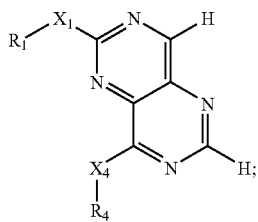
Formula VI

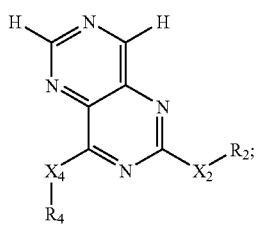
Formula VII

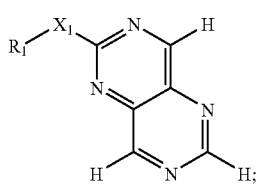
Formula VIII

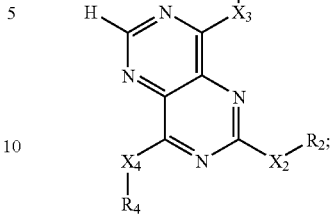
Formula IX

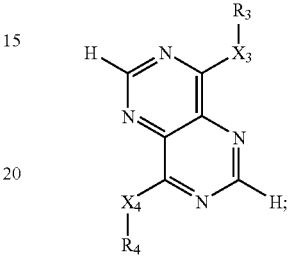
Formula X

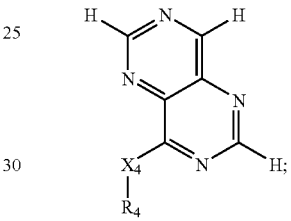
Formula XI wherein $X_1$, $X_2$, $X_3$ and $X_4$ are each independently selected from a group consisting of —O—, —$NR_e$—, —CO— or a single bond (wherein $R_e$ is selected from a group consisting of hydrogen, C1-C30 alkyl groups, C6-C30 aryl groups and C2-C30 heteroaryl groups (including oxygen and/or nitrogen as a heteroatom), and further wherein $R_1$, $R_2$, $R_3$ and $R_4$ are each independently selected from a group consisting of substituted and unsubstituted C6-C30 aryl groups and substituted and unsubstituted C2-C30 heteroaryl groups, in which the substituent to the aryl group or heteroaryl group is at least one substituent selected from the group consisting of —OH, —$NR_aR_b$, —$CONR_aR_b$, —$COR_c$, —$COOR_d$ (wherein $R_a$ and $R_b$ are each independently selected from a group consisting of hydrogen, C1-C30 alkyl groups, C6-C30 aryl groups, C2-C30 heteroaryl groups; $R_c$ is selected from a group consisting of hydrogen, a hydroxyl group, halogens, C1-C30 alkyl groups, C6-C30 aryl groups and C2-C30 heteroaryl groups; and $R_d$ is selected from a group consisting of C1-C30 alkyl groups, C6-C30 aryl groups and C2-C30 heteroaryl groups), C1-C30 hydroxyalkyl groups, C2-C30 heteroaryl groups containing nitrogen and/or oxygen as a heteroatom, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

The aromatic ring compounds corresponding to Formulas III to XI may be characterized as pyrimidopyrimidine oligothiophene derivatives having a PNP structure, including, for example, pyrimidopyrimidine, in which the molecules exhibit n-type semiconductor properties at the central portion of the molecule and with oligothiophene portions exhibiting p-type semiconductor properties extending from the central pyrimidopyrimidine region. Accordingly, such compounds exhibit both p-type properties and n-type properties simultaneously on distinct regions of the compound and, when utilized as an organic semiconductor material, will tend to exhibit improved uniformity in the oxidation potential and improved stability.

Example embodiments of aromatic ring compounds that may exhibit this combination of properties include the compounds represented by Formulas XII and XIII as illustrated below:

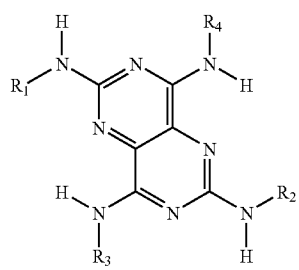

Formula XII

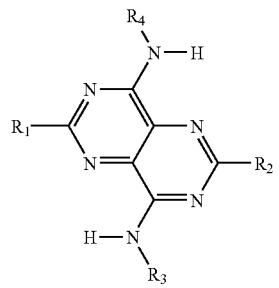

Formula XIII $R_1$, $R_2$, $R_3$ and $R_4$ are to be interpreted consistently with the description of these substituents as defined above in connection with Formulas III to XI.

In particular, those compounds represented by Formulas XIV and XV as illustrated below are expected to be suitable for use in forming organic semiconductor compositions, forming organic semiconductor layers from such compositions and fabricating OTFTs that include such layers:

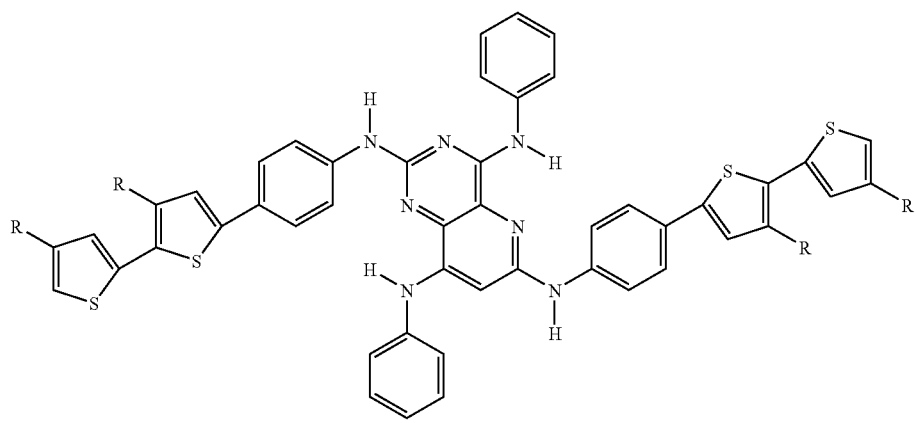

Formula XIV

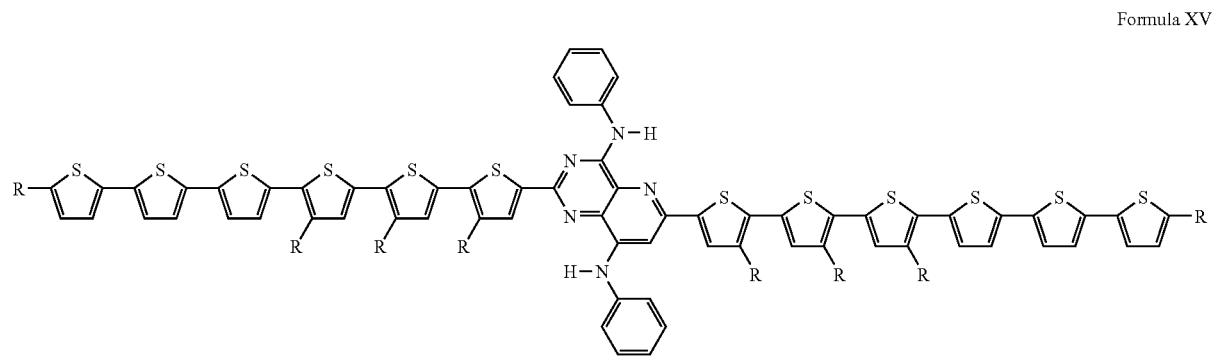

Formula XV wherein R is selected from the group consisting of —H, —OH, —NR$_a$R$_b$, —CONR$_a$R$_b$, —COR$_c$, —COOR$_5$ (wherein R$_a$ and R$_b$ are each independently selected from a group consisting of hydrogen, C1-C30 alkyl groups, C6-C30 aryl groups and C2-C30 heteroaryl groups; R$_c$ is selected from a group consisting of hydrogen, a hydroxyl group, halogens, C1-C30 alkyl groups, C6-C30 aryl groups and C2-C30 heteroaryl groups; and R$_d$ is selected from a group consisting of C1-C30 alkyl groups, C6-C30 aryl groups and C2-C30 heteroaryl groups), C1-C30 hydroxyalkyl groups, C2-C30 heteroaryl groups containing nitrogen or oxygen as the heteroatom(s), halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

Additional example embodiments of aromatic ring compounds within Formula I include the compounds represented by Formulas XVI and XVII below:

Example embodiments of aromatic ring compounds according to Formula I will typically exhibit a weight average molecular weight (Mw) ranging from 100 to 10,000. Further, example embodiments of aromatic ring compounds according to Formula II are not particularly limited, and may include, for example, one or more of the compounds illustrated in Groups III and IV below:

Group III:

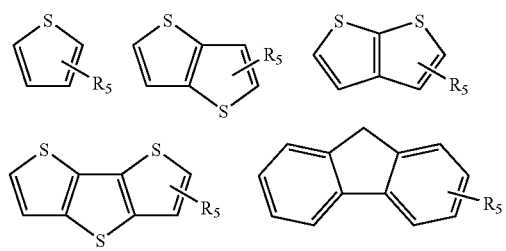

Formula XVI

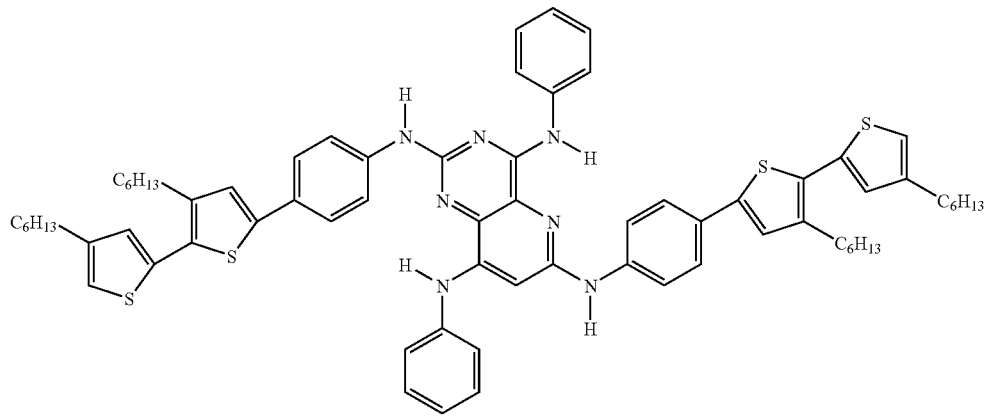

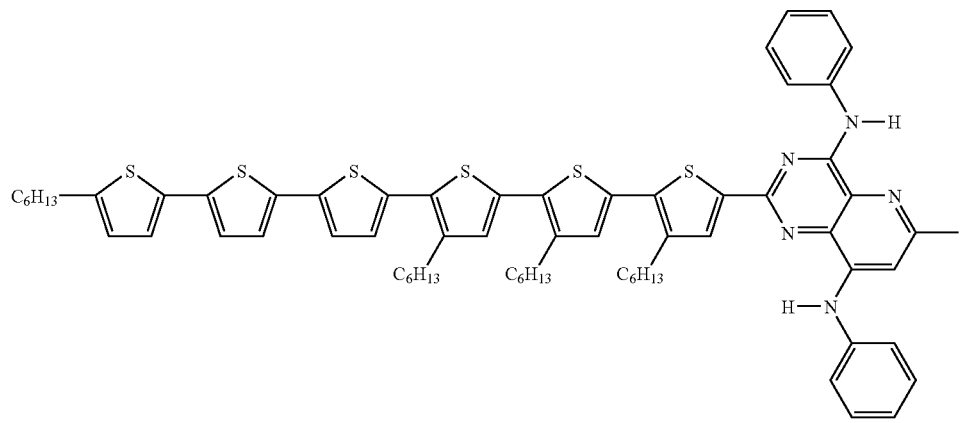

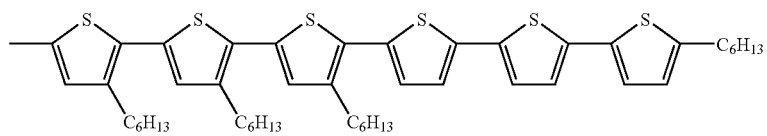

-continued

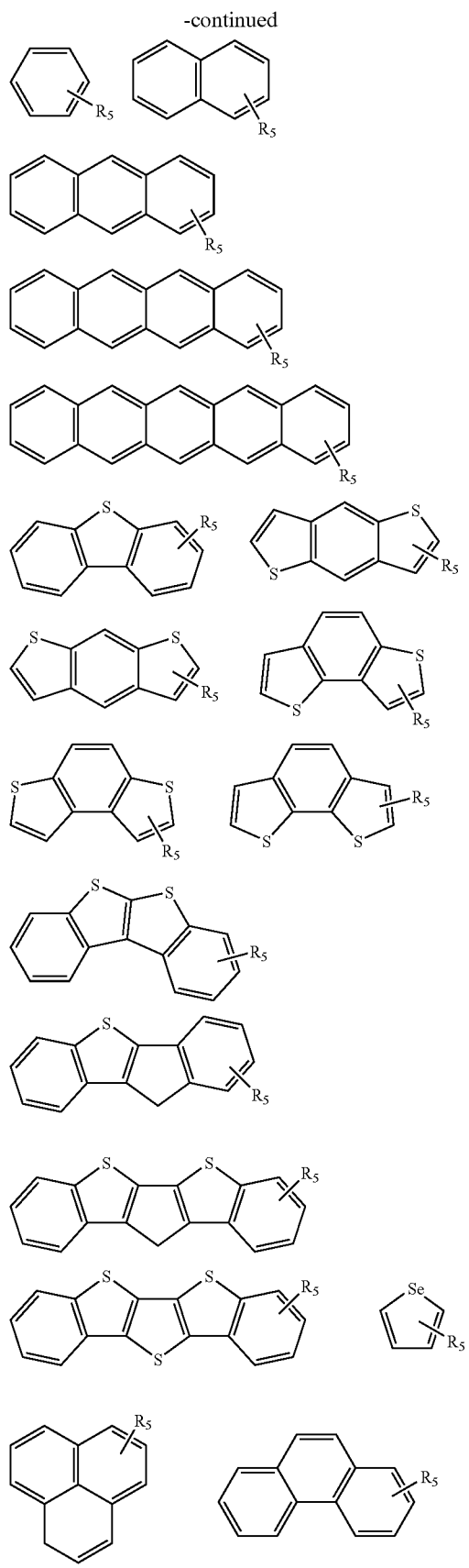

Group IV:

wherein the groups $R_5$ and $R_6$ are independently selected from a group consisting of hydrogen, a hydroxyl group, —$NR_aR_b$, —$CONR_aR_b$, —$COR_c$, —$COOR_d$ (wherein $R_a$ and $R_b$ are each independently selected from a group consisting of hydrogen, C1-C30 alkyl groups, C6-C30 aryl groups and C2-C30 heteroaryl groups; $R_c$ is selected from a group consisting of hydrogen, a hydroxyl group, halogens, C1-C30 alkyl groups, C6-C30 aryl groups and C2-C30 heteroaryl groups; and $R_d$ is selected from a group consisting of C1-C30 alkyl groups, C6-C30 aryl groups and a C2-C30 heteroaryl group), C1-C30 hydroxyalkyl groups, C2-C30 heteroaryl groups containing at least one of nitrogen or oxygen as a heteroatom, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

Example embodiments of compounds may include an aromatic ring compound according to Formula II that is be positioned between aromatic ring compounds according to Formula I and thereby provide improved intermolecular stacking that may be attributable to the formation of strong H-bonds between adjacent molecules. Accordingly, the compound according to Formula II should have a relatively low molecular weight and a structure complementary to the structure of the compound according to Formula I. Without being bound by theory, it is believed that such structures allow for increased formation of H-bonds between those portions of the compounds according to Formula I while generally maintaining the desirable properties of the compound according to Formula I. In particular, to form various H-bonds between the compounds of Formulas I and II, the compound of Formula II may be substituted with one or more substituent, for example, —COOH, —NH—, or others as noted above.

Example embodiments of compounds according to Formula II include, without limitation, thiophene carboxylic acid, 2,5-thiophenedicarboxylic acid, benzoic acid, phthalic acid, naphthalic acid, naphthalene dicarboxylic acid, biphenyl-4,4'-dicarboxylic acid, 4'-hydroxy-4-biphenyldicarboxylic acid, benzylamine, thiophene carboxylamide, thiophene ethyl amine, phenol, thiophene methanol, thiophene ethanol, and 2,2'-bipyridine-4,4'-dicarboxylic acid. These aromatic ring compounds according to Formula II will typically exhibit a molecular average molecular weight (Mw) ranging from 50 to 10,000.

Example embodiments of organic semiconductor materials may be prepared by combining one or more aromatic ring compounds according to Formula II with one or more aromatic ring compounds according to of Formula I. The amount of aromatic ring compound(s) according to Formula II may be combined in an amount constituting from 0.001 to 1000 equivalents based on the amount of the compound(s) according to Formula I. More typically, the amount of aromatic ring compound(s) according to Formula II will be from 0.01 to 10 equivalents based on the amount of aromatic ring compound (s) according to Formula I. Without being bound by theory, it is believed that semiconducting properties or metallic properties may be exhibited by the combination of very small amounts of the aromatic ring compound(s) according to Formula II that will tend not to interfere with the semiconductor properties generally associated compounds according to Formula I.

The aromatic ring compounds used to fabricate example embodiments of the organic semiconductor material may be synthesized using a variety of conventional processes known to those skilled in the art. An example embodiment of a procedure for synthesizing the aromatic ring compounds as illustrated above in Formula XIV includes reacting a pyrimidopyrimidine, which may be obtained through Reaction I as illustrated below, with an oligothiophene borolane, which may be obtained through Reaction II as illustrated below, in the presence of a palladium catalyst according to Reaction III as illustrated below:

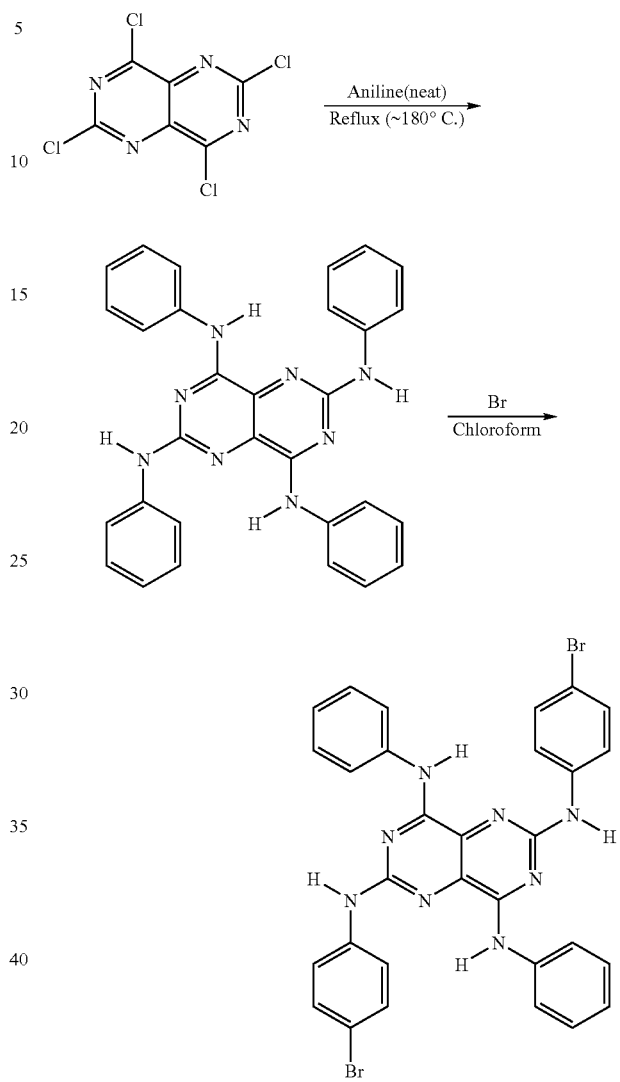

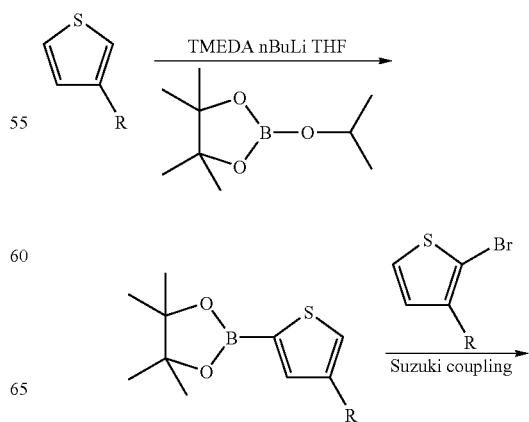

-continued

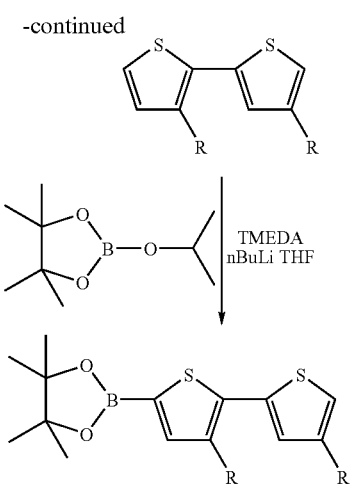

groups containing nitrogen and/or oxygen, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

The compounds, resulting from Reactions I and II, are subjected to a reaction known as Suzuki Coupling and may thereby be synthesized to into the aromatic ring compound of the example embodiments. Suzuki Coupling, although initially designating a palladium-catalyzed cross coupling between an organoboronic acid and a halide, recent catalyst and methods developments have broadened the possible applications to include as reaction partners aryls, alkyls, alkenyls and alkynyls while potassium trifluoroborates and organoboranes or boronate esters may be used in place of boronic acids. In this case, the above reaction is performed using a conventional organic solvent, for example, toluene, N-methylpyrrolidinone, tetrahydrofuran (THF), or dimethylformamide, at a reaction temperature typically in a range from 50° C. to 180° C. for a reaction period typically from 2 to 24 hours under a nitrogen atmosphere.

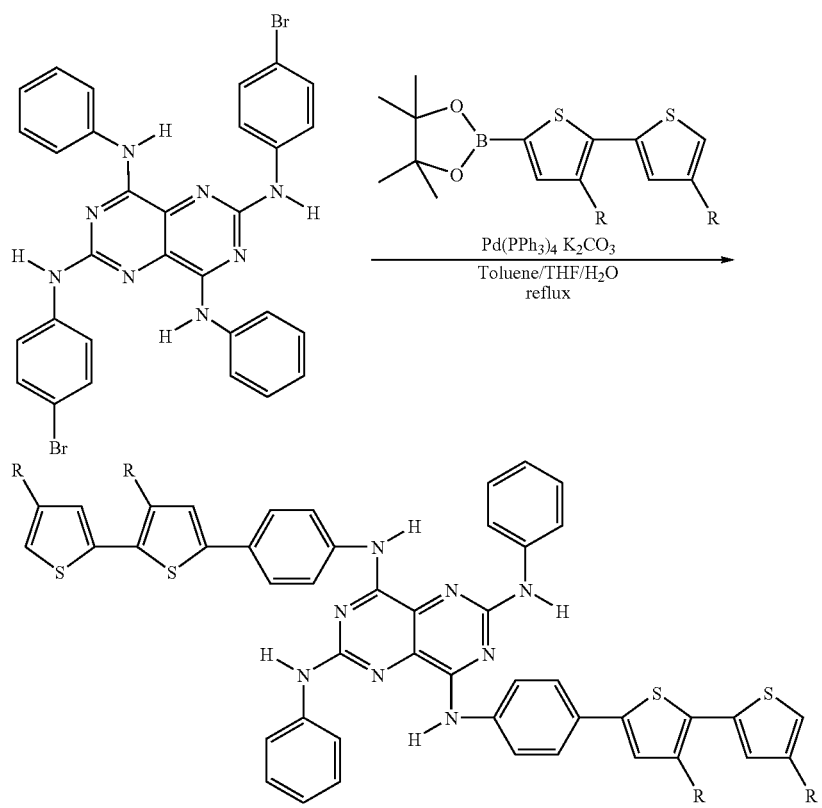

wherein R is selected from a group consisting of —H, —OH, —NR$_a$R$_b$, —CONR$_a$R$_b$, —COR$_c$, —COOR$_d$ (wherein R$_a$ and R$_b$ are each independently selected from a group consisting of hydrogen, C1-C30 alkyl groups, C6-C30 aryl groups and C2-C30 heteroaryl groups; R$_c$ is selected from a group consisting of hydrogen, a hydroxyl group, halogens, C1-C30 alkyl groups, C6-C30 aryl groups and C2-C30 heteroaryl groups; and R$_d$ is selected from a group consisting of C1-C30 alkyl groups, C6-C30 aryl groups and C2-C30 heteroaryl groups), C1-C30 hydroxyalkyl groups, C2-C30 heteroaryl Example embodiments of the aromatic ring compounds may be synthesized in the presence of one or more palladium catalysts represented by Formulas XVIII to XX:

| | |
|---|---|
| PdL$_4$ | Formula XVIII |
| PdL$_2$X$_2$ | Formula XIX |
| PdL$_2$ | Formula XX | wherein L is a ligand selected from a group consisting of triphenylphosphine (PPh$_3$), triphenylarsine (AsPh$_3$), triphenylphosphite (P(OPh)$_3$), diphenylphosphinoferrocene (dppf), diphenylphosphinobutane (dppb), acetate (OAc), and dibenzylidoneacetone (dba), and X is I, Br or Cl. Example embodiments of the aromatic ring compounds may, in turn, be used in formulating compositions useful for forming semiconductor layers when combined with an organic solvent or an organic solvent system.

A range of conventional organic solvents that may be used singly or in combination for formulating such compositions including, for example, alcohols, including methyl alcohol, ethyl alcohol, n-propyl alcohol, isopropyl alcohol, n-butyl alcohol, sec-butyl alcohol, t-butyl alcohol, isobutyl alcohol and/or diacetone alcohol, ketones, including acetone, methylethylketone and/or methylisobutylketone, glycols, including ethyleneglycol, diethyleneglycol, triethyleneglycol, propyleneglycol, butyleneglycol, hexyleneglycol, 1,3-propanediol, 1,4-butanediol, 1,2,4-butanetriol, 1,5-pentanediol, 1,2-hexanediol and/or 1,6-hexanediol, glycol ethers, including ethyleneglycol monomethyl ether and/or triethyleneglycol monoethyl ether, glycol ether acetates, including propyleneglycol monomethyl ether acetate (PG-MEA), acetates, including ethyl acetate, butoxyethoxy ethyl acetate, butyl carbitol acetate (BCA) and/or dihydroterpineol acetate (DHTA), terpineols, trimethyl pentanediol monoisobutyrate (TEXANOL), dichloroethene (DCE), chlorobenzene, and N-methyl-2-pyrrolidone (NMP).

The ratio of the various components included in a particular composition may be determined by those skilled in the art to provide an appropriate combination of properties including, for example, viscosity, in consideration of the intended processes and/or applications in which the composition and the semiconductor material will be utilized. For example, the composition may comprise from 0.1 to 10 wt % (as used herein, the wt % of the components is based on the total weight of the composition) of the organic semiconductor material(s) and from 90 to 99.9 wt % of the organic solvent(s) and/or other conventional components. More typically, it is believed that compositions comprising from 0.5 to 4 wt % of the organic semiconductor material(s) and 96 to 99.5 wt % of the organic solvent(s) and additives may exhibit an acceptable combination of properties.

Further, in order to increase the solubility and stability of the organic semiconductor material(s), the composition may include one or more conventional additives selected from, for example, organic binders, photosensitive monomers, photoinitiators, viscosity controllers/modifiers, storage stabilizers, and/or wetting agents or other surfactants to obtain an acceptable combination of properties. Those skilled in the art will be familiar with the selection and use of such additives and will, accordingly, be able to select one or more suitable additives in consideration of the subsequent processes and the intended end use of the organic semiconductor materials to obtain compositions exhibiting acceptable combinations of properties.

In addition, example embodiments include organic semiconductor thin films that are manufactured using one or more of the compositions to form a semiconductor layer on a substrate. Example embodiments of the compositions may be used in combination with a wide range of substrates which may be selected by those skilled in the art in consideration of the processes to be utilized and the intended use of the semiconductor device. It is anticipated that most, if not all, conventional substrates may be suitable for at least some applications and that those skilled in the art will be capable of selecting one or more substrates that are compatible with the intended processing and use including, inorganic substrates, for example, glass substrates, silicon wafers, silicon on insulator (SOI) wafers, ITO glass substrates, quartz substrates, silica substrates, alumina substrates, plastic substrates, for example, polyethylene naphthalate, polyethylene terephthalate, polycarbonate, polyvinylalcohol, polyacrylate, polyimide, polynorbornene, and polyethersulfone, and/or combinations thereof.

A range of conventional room-temperature wet processes may be used for applying the composition to the substrate including, for example, spin coating, dip coating, roll coating, screen coating, spray coating, spin casting, flow coating, screen printing, ink jetting, and drop casting. Conventional spin coating processes and ink jetting processes, for example, are expected to provide acceptable combinations of convenience, repeatability and uniformity. As will be appreciated by those skilled in the art, the process parameters used in spin coating processes may vary widely, but it is anticipated that acceptable results may be achieved using a spinning speed within a range from 100 to 10,000 rpm. Similarly, it is anticipated that organic semiconductor thin films having a thickness of about 300 to 2,000 Å, may be suitable for many applications, but as will be appreciated by those skilled in the art, organic semiconductor thin films having thicknesses below 300 Å or above 2,000 Å may be more suitable in some applications.

Example embodiments of organic semiconductor thin films may be formed using room-temperature wet processes to apply one or more compositions that include one or more example embodiments of organic semiconductor materials comprising a mixture of aromatic ring compounds configured for improved intermolecular stacking associated with improved H-bonding between adjacent molecules to a substrate. Without being bound by theory, it is believed that such organic semiconductor thin films will tend to exhibit improved intermolecular packing density and improved electrical properties, for example, increased charge mobility and reduced off-state leakage current. Therefore, example embodiments of the organic semiconductor thin films may be effectively applied to various substrates and utilized in various organic electronic devices.

Accordingly, example embodiments include organic electronic devices that incorporate one or more such organic semiconductor thin films as a semiconductor layer or pattern. These organic electronic devices may include, for example, OTFTs, organic EL devices, solar cells and polymer memories or other devices for which the organic semiconductor thin films provide acceptable performance and reliability. In such cases, one or more organic semiconductor thin films according to one or more example embodiments may be incorporated in the above-mentioned devices using any suitable conventional process.

Example embodiments of OTFTs will typically comprise a substrate, a gate electrode, an organic insulating layer, an organic semiconductor layer, and source/drain electrodes, in which the organic semiconductor layer is formed using one or more example embodiments of the organic semiconductor materials. Example embodiments of OTFTs are not particularly limited and may be fabricated in a range of structural configurations including, for example, bottom contact structures, top contact structures and top gate structures. Example embodiments of the organic semiconductor material are expected to be useful in each of the OTFTs configurations which may, in turn, be further modified to adapt the devices for particular applications without substantially compromising the use of example embodiments.

The substrates that may be used with the OTFTs are not particularly limited and may include most, if not all, conventional substrates including, for example, glass substrates, silica substrates, semiconductor substrates and plastic substrates. The plastic substrates may be selected from materials including, for example, polyethylene naphthalate, polyethylene terephthalate, polycarbonate, polyvinylalcohol, polyacrylate, polyimide, polynorbornene and polyethersulfone. The gate electrodes and the source/drain electrodes may be formed using one or more suitably conductive materials, typically a metal, metal alloy and/or metal compound including, for example, gold (Au), silver (Ag), aluminum (Al), nickel (Ni), indium tin oxide (ITO), molybdenum/tungsten (Mo/W), metal silicides, semiconductors, metal nitrides and combinations thereof. Further, the gate electrode and the source/drain electrodes may be formed from conductive films or stacks of films having a total thickness on the order of 500 to 2,000 Å thick, but those skilled in the art will appreciate that both thicker and thinner conductive layers may be utilized in order to achieve, for example, the requirements of particular design rules and/or performance parameters.

The insulating layer may be formed using one or more conventional insulating materials that provide sufficient dielectric properties. The insulating layer may include one or more sublayers and may be formed from one or more insulating materials including, for example, ferroelectric insulators, for example, $Ba_{0.33}Sr_{0.66}TiO_3$ (BST), $Al_2O_3$, $Ta_2O_5$, $La_2O_5$, $Y_2O_3$, $TiO_2$ and combinations thereof, inorganic insulators, for example, $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, AlON and combinations thereof, and/or organic insulators, for example, polyimide, benzenecyclobutene (BCB), parylene, polyacrylate, polyvinyl alcohol, polyvinyl phenol and combinations thereof. Although such insulating layers may typically exhibit a thickness ranging from about 3,000 Å to about 10,000 Å (0.3 μm to 1 m), those skilled in the art will appreciate that insulating layers having both smaller and/or larger thickness values may be more suitable for certain processes and/or intended applications.

A better understanding of the example embodiments may be obtained in light of the following examples which are set forth to illustrate use of example embodiments of organic semiconducting materials, but are not to be construed to limit the disclosure.

PREPARATIVE EXAMPLE 1

Preparation of Pyrimidopyrimidine (4)

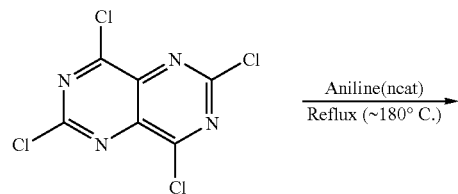

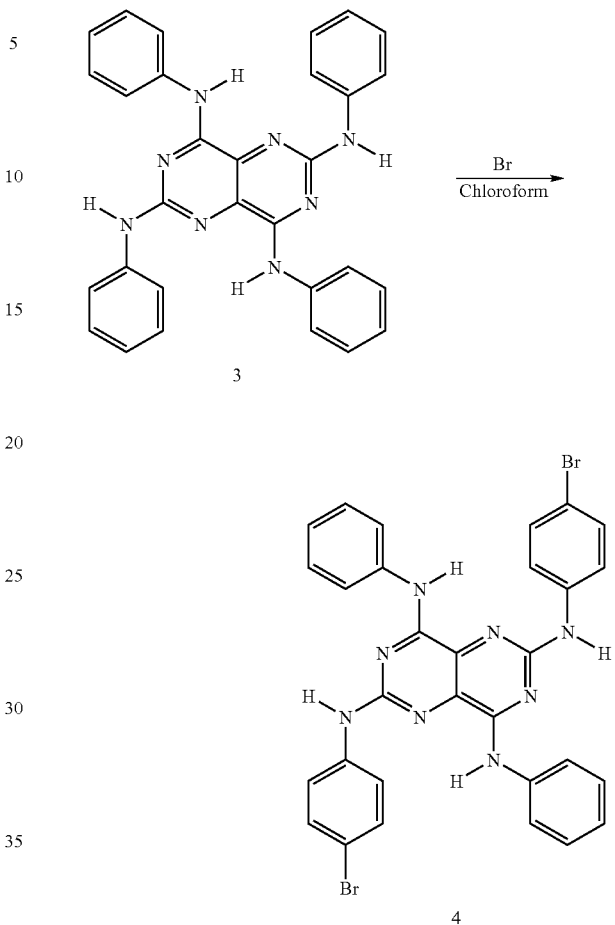

In accord with the synthesis illustrated above, 2.7 g (10 mmol) of 2,4,6,8-tetrachloropyrimidopyrimidine was added to 50 ml of aniline and refluxed under heat at 180° C. for 25 min. Thereafter, the reaction solution was combined with 500 ml of an aqueous solution of 2 N hydrochloric acid, stirred for 30 min, and extracted with chloroform to separate an organic layer. The organic layer was washed with an aqueous sodium bicarbonate solution. The resulting organic layer was distilled under reduced pressure to remove the solvent and then dried in an oven, yielding 5 g of a yellow solid 3. NMR analysis of the yellow solid produced the following data: $^1$H-NMR (DMSO-d6) d(ppm) 6.95 (t, 2H, J=7.4 Hz), 7.14 (t, 2H, J=7.4 Hz), 7.32 (t, 4H, J=7.5 Hz), 7.42 (t, 4H, J=7.5 Hz), 8.95 (s, 2H), 9.31 (s, 2H).

2 g of compound 3 (4.03 mmol) was then slowly added with 5 ml (10 mmol) of bromine in a chloroform solvent and then stirred for 1 hour. The stirred solution was then combined with an aqueous sodium bicarbonate solution and then extracted with chloroform to separate an organic layer. Thereafter, the organic layer was distilled under reduced pressure to remove the majority of the solvent, and was then further dried in an oven, yielding 3 g of dibromide 4. NMR analysis of the dibromide produced the following data: $^1$H-NMR (DMSO-d6) d(ppm) 7.17 (t, 2H, J=7.4 Hz), 7.40-7.47 (m, 8H), 7.78 (d, 4H, J=8.4 Hz), 7.92 (d, 4H, J=8.4 Hz), 9.10 (s, 2H), 9.53 (s, 1H).

PREPARATIVE EXAMPLE 2

Preparation of Oligothiophene Borolane (2)

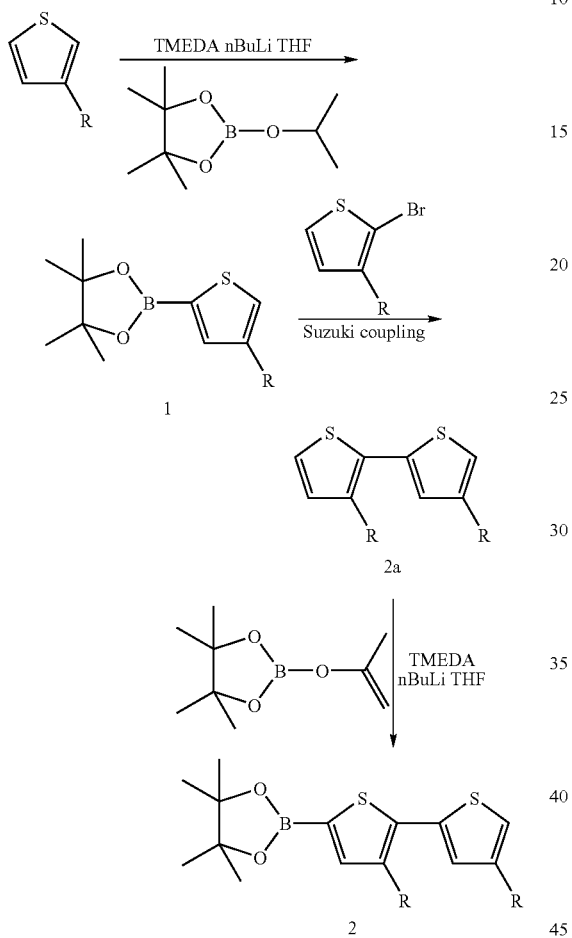

In accord with the synthesis illustrated above, 3-hexyl thiophene was added with n-BuLi in a solvent of tetrahydrofuran (THF) at −20° C., further added with N,N,N',N'-tetramethylethylenediamine (TMEDA), and then heated at 70° C. for 3 hours. Subsequently, dioxaborolane was added at −78° C., and the temperature was gradually increased to room temperature (about 25° C.), thus obtaining thiophene borolane 1.

The thiophene borolane 1 thus synthesized and 2-bromothiophene were added to toluene and water and then allowed to react at 110° C. for 8 hours in the presence of a palladium catalyst, specifically tetrakis(triphenylphosphine)palladium(0) (Pd(PPh$_3$)$_4$, (available from Aldrich), and potassium carbonate, thus obtaining a compound 2a.

The compound 2a thus obtained was then combined with n-BuLi in THF at −20° C., further combined with N,N,N',N'-tetramethylethylenediamine (TMEDA), and then heated at 70° C. for 3 hours. Thereafter, dioxaborolane was added at −78° C., and the temperature was gradually increased to room temperature, yielding oligothiophene borolane 2. NMR analysis of the oligothiophene borolane 2 produced the following data: $^1$H-NMR (300 MHz, CDCl$_3$) d(ppm) 0.89 (t, 3H, J=6.8 Hz), 1.21-1.35 (m, 18H), 1.59-1.66 (m, 2H), 2.58 (t, 2H, J=7.8 Hz), 6.68 (s, 1H), 7.00 (s, 1H), 7.20 (d, 1H, J=3.5 Hz), 7.47 (d, 1H, J=3.5 Hz).

PREPARATIVE EXAMPLE 3

Preparation of Pyrimidopyrimidine (5a)

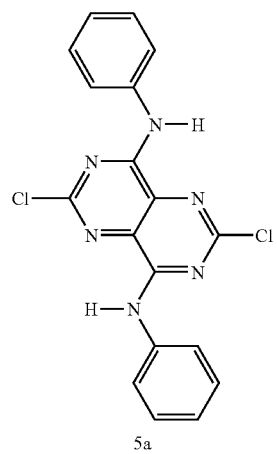

In accord with the synthesis illustrated above, 4 g (19 mmol) of 2,4,6,8-tetrachloropyrimidopyrimidine was added to 50 ml of chloroform, and 8.7 ml (95 mmol) of aniline was slowly added in droplets thereto in a bath at 0° C. After the completion of the reaction was confirmed through TLC, the resulting reaction solution was washed with an aqueous ammonium chloride solution and then extracted with chloroform to separate an organic layer. Thereafter, the organic layer was distilled under reduced pressure to remove the solvent and then dried in an oven, yielding 5 g of a pale yellow solid 5a NMR analysis of the pale yellow solid produced the following data: $^1$H-NMR (DMSO-d6) d(ppm) 7.23 (t, 2H, J=7.3 z), 7.46 (t, 41, J=7.8 Hz), 7.87 (t, 4H, J=8.1 Hz), 8.66 (s, 2H).

PREPARATIVE EXAMPLE 4

Preparation of Oligothiophene Borolane (4)

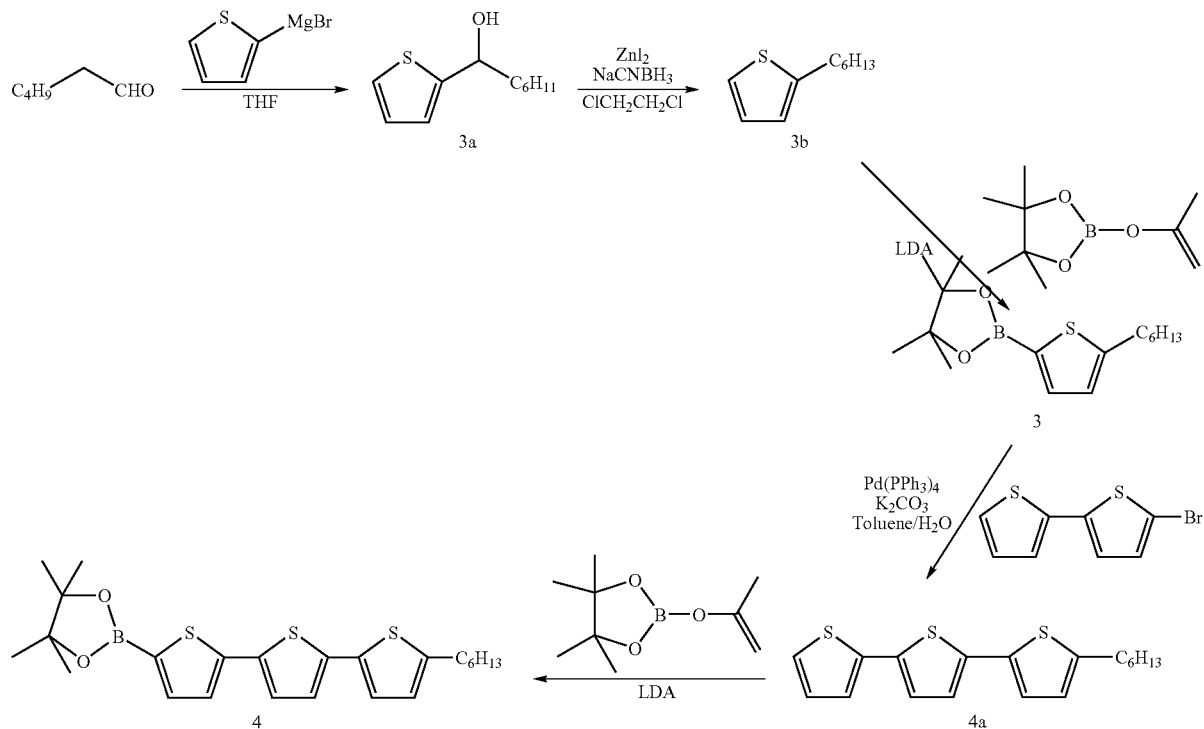

In accord with the synthesis illustrated above, THF was mixed with hexanal and thiophen-2-yl-magnesium bromide was added thereto, thus obtaining a compound 3a. Subsequently, the compound 3a was added with zinc iodide and sodium cyanoborohydride in 1,2-dichloroethane and then heated at 85° C. for 3 hours, to thus prepare a compound 3b, which was then added with lithium diisopropylamide (LDA) in THF at −78° C. Thereafter, dioxaborolane was further added thereto, and thiophene borolane 3 was thus obtained. The compound thus obtained and 2-bromobithiophene were subjected to Suzuki Coupling under the same conditions as utilized above in Preparative Example 1, to produce a compound 4a Lithium diisopropylamide (LDA) in THF was added at −78° C., and then dioxaborolane was further added, thereby synthesizing oligothiophene borolane 4. NMR analysis of the oligothiophene borolane produced the following data: $^1$H-NMR (300 MHz, CDCl$_3$) d(ppm) 0.89 (t, 3H, J=6.8 Hz), 1.25-1.43 (m, 18H), 1.57-1.88 (m, 2H), 2.79 (t, 2H, J=7.5 Hz), 6.68 (d, 2H, J=3.5 Hz), 6.97-7.00 (m, 2H), 7.05 (d, 1H, J=3.5 Hz), 7.21 (d, 1H, J=3.5 Hz), 7.52 (d, 1H, J=3.5 Hz).

SYNTHESIS EXAMPLE 1

Synthesis of Pyrimidopyrimidine Oligothiophene Derivative

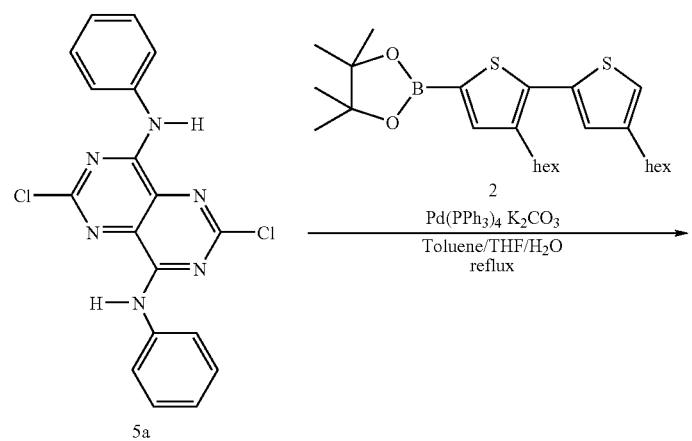

-continued
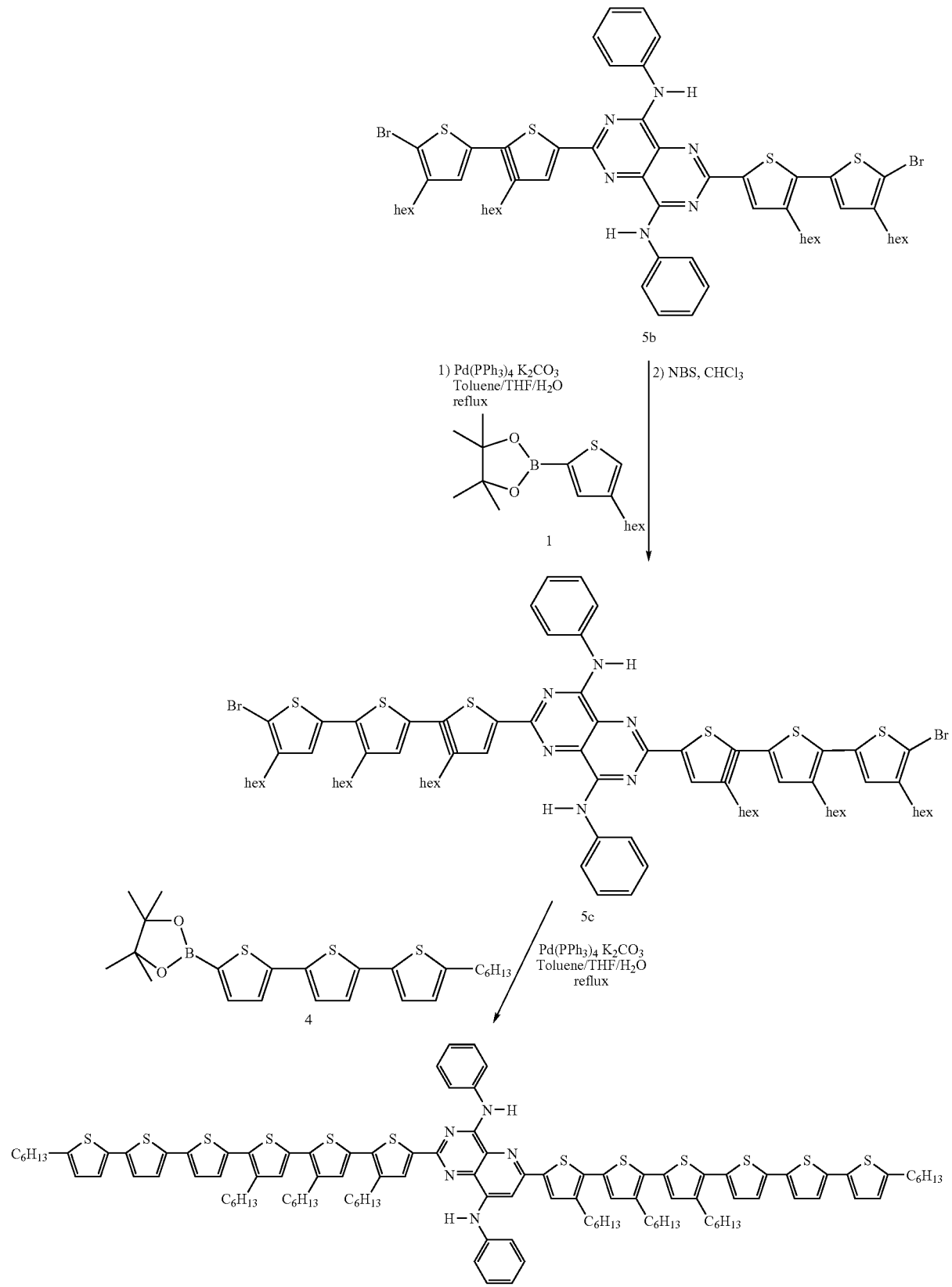

In accord with the synthesis illustrated above, 0.5 g (1.33 mmol) of dichloride 5a obtained as detailed above in Preparative Example 3 and 1.8 g (3.0 mmol) of borolane 2 obtained as detailed above in Preparative Example 2 were added to 30 ml of toluene/THF (3/1) and 10 ml of 2 N potassium carbonate. Further, the reaction mixture was combined with 0.31 g (0.27 mmol) of tetrakis(triphenylphosphine)palladium(0) (Pd (PPh$_3$)$_4$) and then heated at 110° C. for 8 hours under a nitrogen atmosphere. The heated reaction solution was combined with 50 ml of 2 N HCl and extracted with chloroform to separate an organic layer, which was then washed with water, dried over magnesium sulfate, filtered, distilled under reduced pressure and then purified through silica gel column chromatography using hexane/chloroform, thus obtaining 0.92 g of a yellow solid. Subsequently, 0.4 g (0.41 mmol) of the produced compound was dissolved in chloroform, and 0.15 g (0.84 mmol) of N-bromosuccinimide (NBS) was added thereto at 0° C. The resulting solution was combined with an aqueous sodium bicarbonate solution and extracted with chloroform to separate an organic layer, which was then washed with water, dried over magnesium sulfate, filtered, distilled under reduced pressure, and then purified through silica gel column chromatography, yielding 0.43 g of an orange solid 5b. NMR analysis of the orange solid produced the following data: $^1$H-NMR (CDCl$_3$) d(ppm) 0.83-0.94 (m, 12H), 1.25-1.40 (m, 24H), 1.60-1.88 (m, 8H), 2.60 (t, 4H, J=7.5 Hz), 2.76 (br t, 4H, J=7.5 Hz), 6.85 (s, 2H), 7.20 (t, 2H, J=7.3 Hz), 7.48 (t, 4H, J=7.3 Hz), 7.78 (s, 2H), 7.99 (d, 4H, J=7.7 z), 8.80 (s, 2H).

0.43 g (0.38 mmol) of dibromide 5b and 0.34 g (1.14 mmol) of borolane 1 were then added to 30 ml of toluene/THF (3/1) and 10 ml of 2 N potassium carbonate to form a reaction mixture. The reaction mixture was combined with 0.22 g (0.19 mmol) of tetrakis(triphenylphosphine) palladium(0) and then heated at 110° C. for 8 hours under a nitrogen atmosphere. The heated solution was then combined with 50 ml of 2 N HCl and extracted with chloroform to separate an organic layer, which was then washed with water, dried over magnesium sulfate, filtered, distilled under reduced pressure, and then purified through silica gel column chromatography using hexane/chloroform, thus obtaining 0.44 g of a sticky orange solid. Thereafter, 0.44 g (0.34 mmol) of the resulting compound was dissolved in chloroform, and 0.12 g (0.69 mmol) of N-bromosuccinimide was added thereto at 0° C. Thereafter, the reaction solution was combined with an aqueous sodium bicarbonate solution and thereafter extracted with chloroform to separate an organic layer, which was then washed with water, dried over magnesium sulfate, filtered, distilled under reduced pressure, and then purified through silica gel column chromatography, yielding 0.47 g of a red solid 5c. NMR analysis of the red solid produced the following data: $^1$H-NMR (CDCl$_3$) d(ppm) 0.87-0.94 (m, 18H), 1.25-1.45 (m, 36H), 1.60-1.75 (m, 12H), 2.58 (t, 4H, J=7.4 Hz), 2.71-2.83 (m, 8H), 6.85 (s, 2H), 7.04 (s, 2H), 7.19 (t, 2H, J=7.4 Hz), 7.47 (t, 4H, J=7.4 Hz), 7.77 (s, 2H), 7.80 (d, 4H, J=7.4 Hz), 8.78 (s, 2H).

0.47 g (0.31 mmol) of dibromide 5c and 0.36 g (0.78 mmol) of borolane 4 obtained as detailed above Preparative Example 4 were added to 30 ml of toluene/THF (3/1) and 10 ml of 2 N potassium carbonate to from a reaction mixture. The reaction mixture was then added with 0.22 g (0.19 mmol) of tetrakis (triphenylphosphine)palladium(0) and heated at 110° C. for 8 hours under a nitrogen atmosphere. The heated reaction solution was combined with 50 ml of 2 N HCl and extracted with chloroform to separate an organic layer, which was then washed with water, dried over magnesium sulfate, filtered, distilled under reduced pressure, and then purified through silica gel column chromatography using hexane/chloroform, yielding 0.43 g of a red solid (a pyrimidopyrimidine oligothiophene derivative). NMR analysis of the red solid produced the following data: $^1$H-NMR (CDCl$_3$) d(ppm) 0.90-0.94 (m, 24H), 1.26-1.55 (m, 48H), 1.62-1.70 (m, 16H), 2.74-2.82 (m, 16H), 6.70 (s, 2H), 6.98-7.11 (m, 14H), 7.19 (t, 2H, J=7.4 Hz), 7.50 (t, 4H, J=7.4 Hz), 7.79 (s, 2H), 8.03 (d, 4H, J=7.4 Hz), 8.82 (br s, 2H).

EXAMPLE 1

Figure 2:
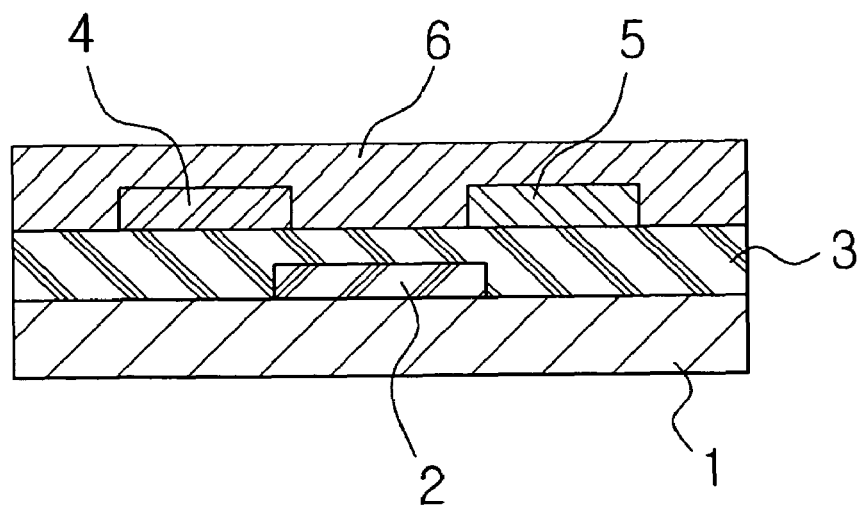
FIG. 2 illustrates an example embodiment of a structure of an OTFT that may be manufactured as described below in Example 1.

Starting with the pyrimidopyrimidine oligothiophene derivative obtained in the manner described above in Synthesis Example 1, thiophene carboxylic acid was added in an amount of 0.1 equivalents based on the amount of the derivative. An example embodiment of a composition was then prepared by dissolving the resulting mixture to form a 2 wt % solution in toluene. A chromium layer for forming a gate electrode was deposited on a washed plastic substrate to a thickness of 1,000 Å using a sputtering process. A SiO$_2$ layer was then deposited on the gate electrode using a conventional CVD process to form a gate insulating film having a thickness of 1,000 Å. Thereafter, ITO was deposited on the gate insulating film to a thickness of 1,200 Å using a sputtering process for use as source/drain electrodes, thereby configuring the substrate for deposition of the organic semiconductor material. However, before depositing the organic semiconductor material, the substrate was washed with isopropyl alcohol for 10 minutes and dried. The substrate was then immersed in a 10 mM octadecyltrichlorosilane solution, which had been diluted with hexane, for 30 seconds, washed with acetone, and dried to complete preparation of the substrate. The previously prepared composition was then applied to the substrate to form a layer having a thickness of 800 Å using a spin coating process at 1,000 rpm and baked at 100° C. for 1 hour in an argon atmosphere, thereby forming an organic semiconductor layer and completing an OTFT structure having a bottom contact configuration generally corresponding to the structure illustrated in FIG. 2.

EXAMPLE 2

An OTFT was manufactured in the same manner as detailed above in Example 1, with the exception that a mixture, obtained by adding thiophene carboxylic acid to the pyrimidopyrimidine oligothiophene derivative of Synthesis Example 1 in an amount of 1 equivalent based on the amount of derivative, was used as the organic semiconductor material for the formation of a semiconductor layer.

EXAMPLE 3

An OTFT was manufactured in the same manner as in Example 1, with the exception that a mixture, obtained by adding thiophene carboxylic acid to the pyrimidopyrimidine oligothiophene derivative of Synthesis Example 1 in an amount of 10 equivalents based on the amount of derivative, was used as the organic semiconductor material for the formation of a semiconductor layer.

EXAMPLE 4

An OTFT was manufactured in the same manner as in Example 1, with the exception that a mixture, obtained by adding thiophene ethylamine to the pyrimidopyrimidine oligothiophene derivative of Synthesis Example 1 in an amount of 1 equivalent based on the amount of derivative, was used as the organic semiconductor material for the formation of a semiconductor layer.

EXAMPLE 5

An OTFT was manufactured in the same manner as in Example 1, with the exception that a mixture, obtained by adding 2,2'-bipyridine-4,4'-dicarboxylic acid to the pyrimidopyrimidine oligothiophene derivative prepared in accord with Synthesis Example 1 in an amount of 1 equivalent based on the amount of derivative, was used as the organic semiconductor material for the formation of a semiconductor layer.

COMPARATIVE EXAMPLE 1

An OTFT was manufactured in the same manner as in Example 1, with the exception that only the pyrimidopyrimidine oligothiophene derivative of Synthesis Example 1 was used as the material for the formation of a semiconductor layer.

Evaluation of Properties of OTFTs

Figure 3:
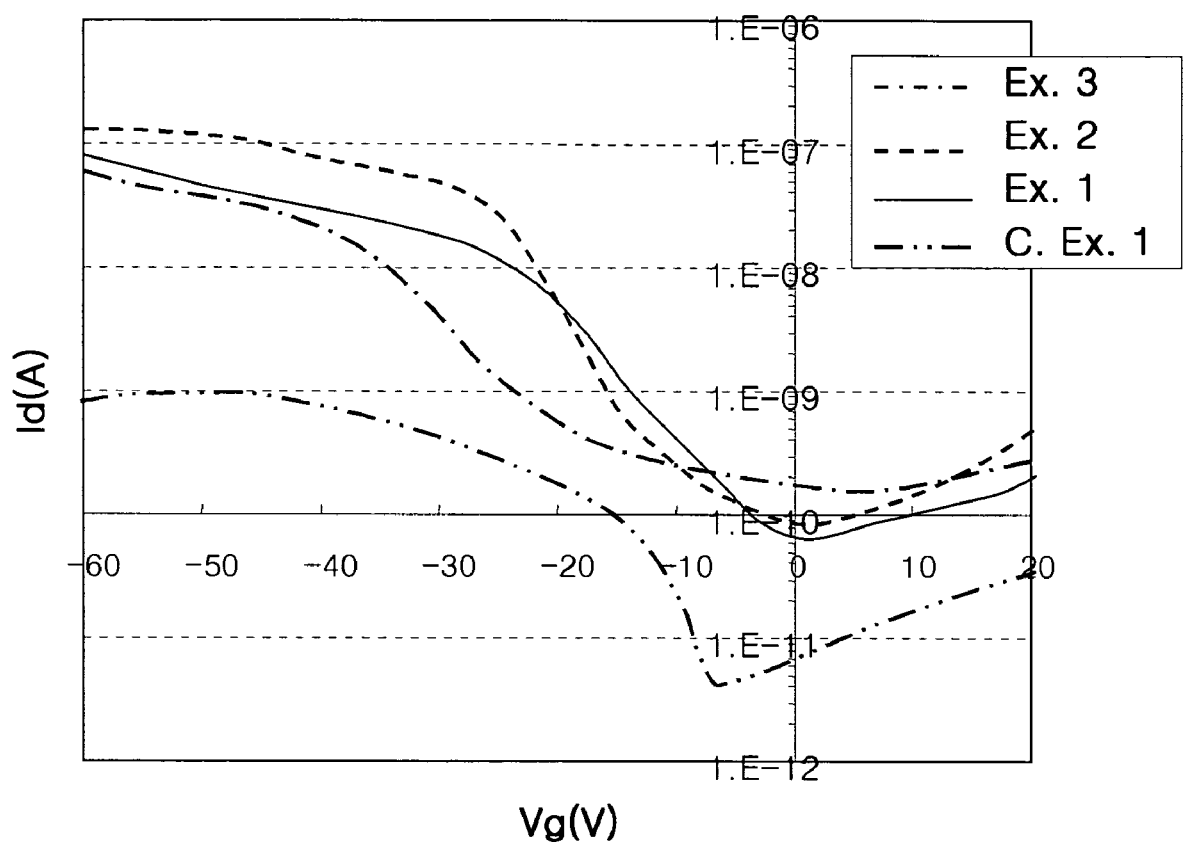
FIG. 3 is a graph illustrating the respective current transfer properties of OTFTs manufactured in accord with Examples 1 to 3 and Comparative Example 1.

In order to evaluate the electrical properties of the OTFTs manufactured in Examples 1 to 5 and Comparative Example 1, current transfer properties thereof were measured using a semiconductor analyzer (4200-SCS, available from KEITHLEY). The results are shown in FIG. 3. As shown in FIG. 3, in the OTFTs manufactured in the examples of the example embodiments, the current in an on-state was greatly increased compared to the OTFT of Comparative Example 1, thus simultaneously improving charge mobility and $I_{on}/I_{off}$. In addition, the charge mobility and $I_{on}/I_{off}$ of the OTFTs of Examples 1 to 5 and Comparative Example 1 were measured according to the following procedures. The results are given in TABLE 1 below.

Charge Mobility

The charge mobility was calculated from the following current equation for the saturation region using the above current transfer curve. That is, the current equation for the saturation region was converted into a graph of $(I_{SD})^{1/2}$ to $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu WC_0}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, $\mu$ or $\mu_{FET}$ is charge mobility, $C_o$ is oxide film capacitance, W is the channel width, L is the channel length, $V_G$ is the gate voltage, and $V_T$ is the threshold voltage.

$I_{on}/I_{off}$

The $I_{on}/I_{off}$ ratio was determined from the ratio of maximum current in the on-state to minimum current in the off-state. The $I_{on}/I_{off}$ ratio is represented by the following equation:

$$\frac{Ion}{Ioff} = \left(\frac{\mu}{\sigma}\right)\frac{C_0^2}{qN_A t^2}V_D^2$$

wherein $I_{on}$ is maximum current, $I_{off}$ is off-state leakage current, $\mu$ is charge mobility, $\sigma$ is the conductivity of the thin film, q is the quantity of electric charge, $N_A$ is the density of electric charge, t is the thickness of the semiconductor film, $C_0$ is the capacitance of the oxide film, and $V_D$ is the drain voltage. The off-state leakage current ($I_{off}$), which is the current flowing in the off-state, was determined to be the minimum current in the off-state.

TABLE 1

| Example No. | Charge Mobility (cm²/V$_s$) | ON (A) | ON/OFF |
|---|---|---|---|
| 1 | 0.00185 | $0.74 \times 10^{-8}$ | $1.09 \times 10^{-3}$ |
| 2 | 0.01230 | $1.37 \times 10^{-7}$ | $1.52 \times 10^{-3}$ |
| 3 | 0.00268 | $5.95 \times 10^{-8}$ | $3.36 \times 10^{-3}$ |
| 4 | 0.00080 | $0.51 \times 10^{-8}$ | $2.43 \times 10^{-3}$ |
| 5 | 0.04530 | $7.33 \times 10^{-7}$ | $2.63 \times 10^{-3}$ |
| Comp. 1 | 0.00010 | $9.16 \times 10^{-10}$ | $2.03 \times 10^{-2}$ |

As is apparent from TABLE 1, the OTFTs manufactured according to Examples 1 to 5 using the organic semiconductor material of the example embodiments exhibited improved $I_{on}$ current, typically equaling about 10 to 1000 times the performance achieved by the OTFT manufactured according to Comparative Example 1, and correspondingly improved charge mobility equaling about 20 to 120 times the performance achieved in the Comparative Example 1.

As described above, example embodiments include organic semiconductor materials incorporating one or more compounds configured for increasing the degree of molecular stacking in the resulting organic semiconductor thin films, compositions comprising such materials, organic semiconductor thin films formed using such compositions, and organic electronic devices incorporating such thin films. As detailed above, example embodiments include mixtures of relatively low molecular weight aromatic ring compounds that include heteroatoms, for example, nitrogen or oxygen, that will increase the stacking tendencies of the molecules and compositions including such compounds that are suitable for application using a range of room temperature and atmospheric pressure processes and exhibit sufficient stability in light of subsequent processing and the intended use of the resulting electronic devices. Although not wishing to be bound by theory, it is believed that example embodiments of the compounds induce intermolecular stacking within the organic semiconductor layers as a result of the formation of H-bonds between adjacent molecules, thereby increasing the intermolecular packing density that, in turn, may provide improved electrical properties including, for example, increased charge mobility and/or reduced off-state leakage current Although certain example embodiments have been disclosed above for illustrative purposes, those skilled in the art will appreciate that various modifications, additions and substitutions are possible, without departing from the scope and spirit of the materials, films, devices and processes provided in this disclosure.

What is claimed is:

1. An organic semiconductor composition, comprising:
   a first quantity of a first aromatic ring compound according to Formula I;

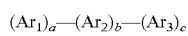  Formula I wherein $Ar_1$, $Ar_2$ and $Ar_3$ are each independently selected from a group consisting of substituted and unsubstituted C6-C30 aryl groups or substituted and unsubstituted C2-C30 heteroaryl groups, at least one ring carbon of at least one of $Ar_1$, $Ar_2$ and $Ar_3$ is substituted with nitrogen or oxygen, and a, b and c are each independently selected from integers from 0 to 20 and satisfy the expression (a+b+c) >0; and
   a second quantity of a second aromatic ring compound according to Formula II;

  Formula II wherein $Ar_4$ and $Ar_5$ are each independently selected from a group consisting of substituted and unsubstituted C6-C30 aryl groups and substituted and unsubstituted C2-C30 heteroaryl groups, at least one hydrogen atoms thereof being substituted with a substituent containing —NH or —OH,
   d and e are each independently selected from integers from 0 to 10 and satisfy the expression (d+e)≠0, and
   the first aromatic ring compound according to Formula I and the second aromatic ring compound according to Formula II are joined by hydrogen bonds.

2. The organic semiconductor composition according to claim 1, wherein:
   at least one hydrogen atom of at least one of $Ar_1$, $Ar_2$ and $Ar_3$ is replaced with a substituent selected from a group consisting of —OH, —$NR_aR_b$, —$CONR_aR_b$, wherein $R_a$ and $R_b$ are each independently selected from a group consisting of hydrogen, C1-C30 alkyl groups, C6-C30 aryl groups and a C2-C30 heteroaryl groups,
   —$COR_c$, wherein $R_c$ is selected from a group consisting of hydrogen, a hydroxyl group, halogens, C1-C30 alkyl groups, C6-C30 aryl groups and C2-C30 heteroaryl groups,
   —$COOR_d$, wherein $R_d$ is selected from a group consisting of C1-C30 alkyl groups, C6-C30 aryl groups and C2-C30 heteroaryl groups,
   C1-C30 hydroxyalkyl groups and C2-C30 heteroaryl groups containing at least one nitrogen or oxygen heteroatom.

3. The organic semiconductor composition according to claim 1, wherein:
   the aryl groups and heteroaryl groups are selected from the group consisting of substituted and unsubstituted compounds corresponding to Group I,

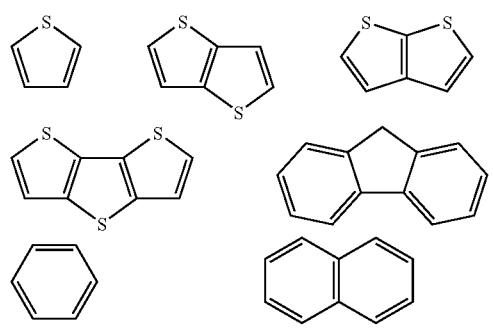

and Group II,

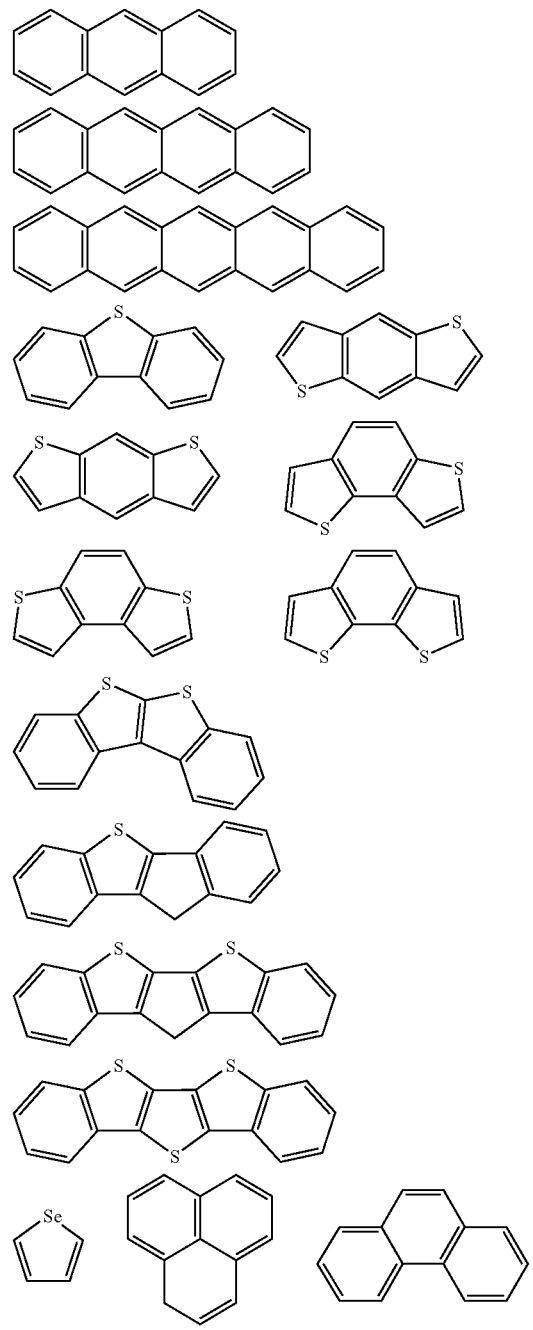

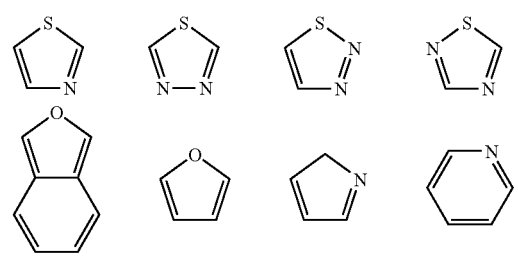

-continued

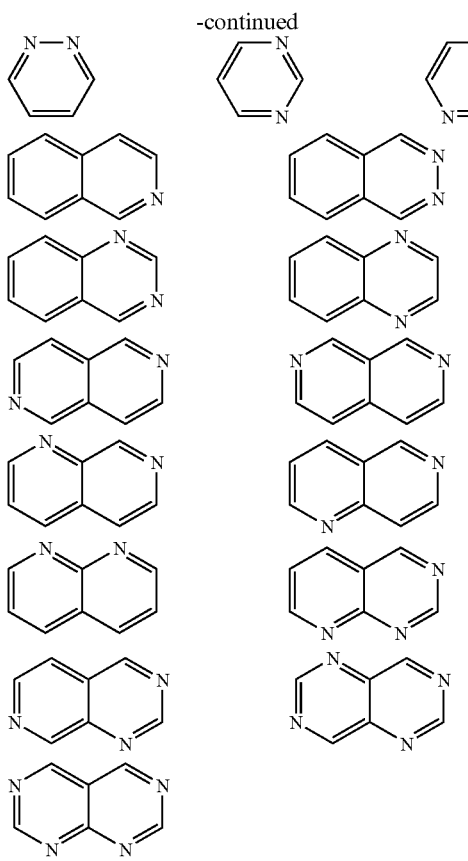

and mixtures thereof.

4. The organic semiconductor composition according to claim 3, wherein:

the substituted aryl groups and heteroaryl groups include a substituent selected from a group consisting of —OH, —NR$_a$R$_b$, —CONR$_a$R$_b$, wherein R$_a$ and R$_b$ are each independently selected from a group consisting of hydrogen, C1-C30 alkyl groups, C6-C30 aryl groups and C2-C30 heteroaryl groups, —COR$_c$, wherein R$_c$ is selected from a group consisting of hydrogen, a hydroxyl group, halogens, C1-C30 alkyl groups, C6-C30 aryl groups and C2-C30 heteroaryl groups, —COOR$_d$, wherein R$_d$ is selected from a group consisting of C1-C30 alkyl groups, C6-C30 aryl groups and C2-C30 heteroaryl groups;

C1-C30 hydroxyalkyl groups, C2-C30 heteroaryl groups containing at least one of nitrogen and oxygen as a heteroatom, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

5. The organic semiconductor composition according to claim 1, wherein:

the aromatic ring compound according to Formula I is selected from a group of compounds according to Formulas III to XI:

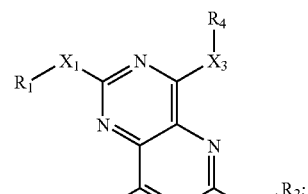

Formula III

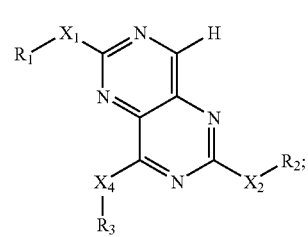

Formula IV

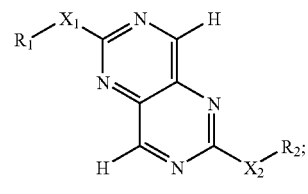

Formula V

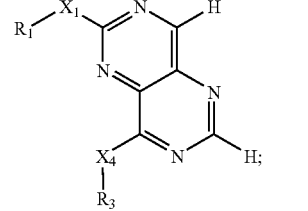

Formula VI

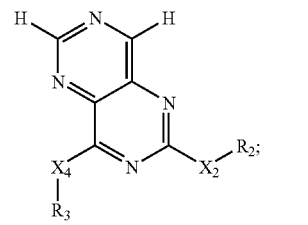

Formula VII

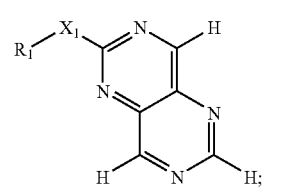

Formula VIII

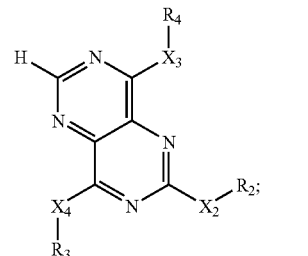

Formula IX

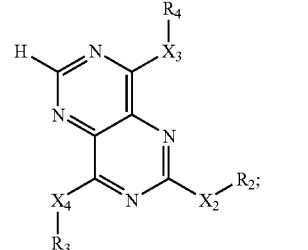

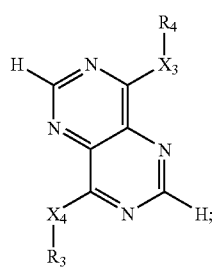

Formula X

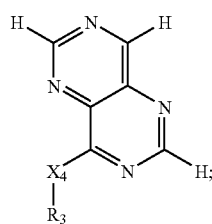

Formula XI

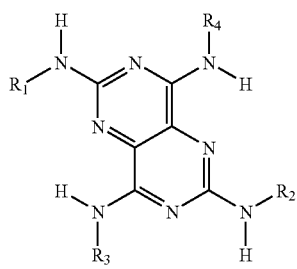

Formula XII

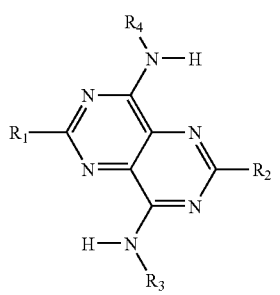

Formula XIII wherein $X_1$, $X_2$, $X_3$ and $X_4$ are each independently selected from a group consisting of —O—, —NR$_e$—, wherein R$_e$ is selected from a group consisting of hydrogen, C1-C30 alkyl groups, C6-C30 aryl groups and C2-C30 heteroaryl groups, —CO— or a single bond;

wherein $R_1$, $R_2$, $R_3$ and $R_4$ are each independently selected from a group consisting of substituted and unsubstituted C6-C30 aryl groups and substituted and unsubstituted C2-C30 heteroaryl groups, wherein the substituted aryl groups and substituted heteroaryl groups include at least one substituent selected from a group consisting of —OH, —NR$_a$R$_b$, —CONR$_a$R$_b$, wherein R$_a$ and R$_b$ are each independently selected from a group consisting of hydrogen, C1-C30 alkyl groups, C6-C30 aryl groups and C2-C30 heteroaryl groups, —COR$_c$, wherein R$_c$ is selected from a group consisting of hydrogen, a hydroxyl group, halogens, C1-C30 alkyl groups, C6-C30 aryl groups and C2-C30 heteroaryl groups, —COOR$_d$, wherein R$_d$ is selected from a group consisting of C1-C30 alkyl groups, C6-C30 aryl groups and C2-C30 heteroaryl groups, C1-C30 hydroxyalkyl groups, C2-C30 heteroaryl groups containing at least one of nitrogen and oxygen as a heteroatom, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups, and C5-C30 cycloalkyl groups.

6. The organic semiconductor composition according to claim 1, wherein:
the aromatic ring compound corresponding to Formula I is selected from a group consisting of compounds corresponding to Formulas XII and XIII:

wherein $R_1$, $R_2$, $R_3$ and $R_4$ are each independently selected from a group consisting of substituted and unsubstituted C6-C30 aryl groups and substituted and unsubstituted C2-C30 heteroaryl groups, wherein the substituted aryl groups and substituted heteroaryl groups include at least one substituent selected from a group consisting of —OH, —NR$_a$R$_b$, —CONR$_a$R$_b$, wherein R$_a$ and R$_b$ are each independently selected from a group consisting of hydrogen, C1-C30 alkyl groups, C6-C30 aryl groups and C2-C30 heteroaryl groups, —COR$_c$, wherein R$_c$ is selected from a group consisting of hydrogen, a hydroxyl group, halogens, C1-C30 alkyl groups, C6-C30 aryl groups and C2-C30 heteroaryl groups, —COOR$_d$, wherein R$_d$ is selected from a group consisting of C1-C30 alkyl groups, C6-C30 aryl groups and C2-C30 heteroaryl groups, C1-C30 hydroxyalkyl groups, C2-C30 heteroaryl groups containing at least one of nitrogen and oxygen as a heteroatom, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups, and C5-C30 cycloalkyl groups.

7. The organic semiconductor composition according to claim 1, wherein:
the aromatic ring compound corresponding to Formula I is selected from a group consisting of compounds corresponding to Formulas XIV and XV:

Formula XIV

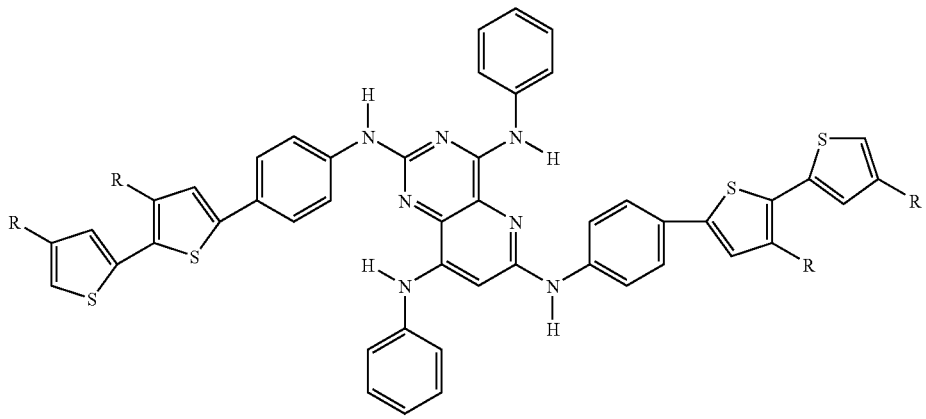

Formula XV

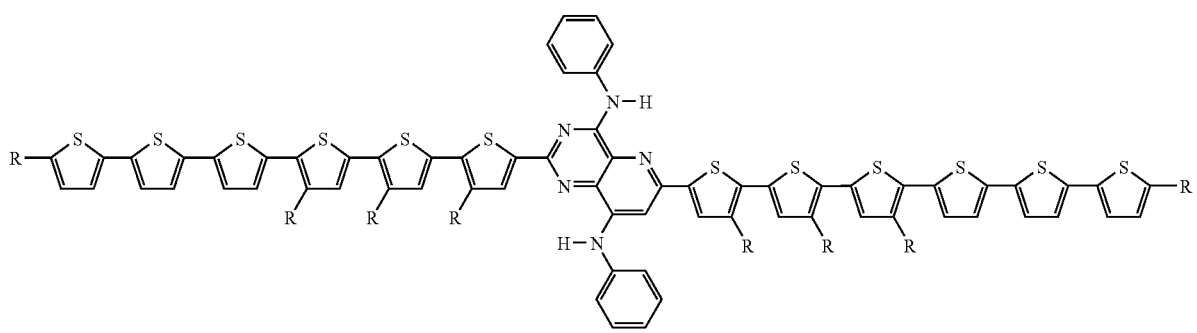

wherein R is selected from the group consisting of —H, —OH, —NR$_a$R$_b$, -group, or a C2-C30 heteroaryl group, —COR$_c$, R$_c$ is hydrogen, a hydroxyl group, halogen, a C1-C30 alkyl group, a C6-C30 aryl group, or a C2-C30 heteroaryl group, and —COOR$_d$, wherein R$_d$ is a C1-C30 alkyl group, a C6-C30 aryl group, or a C2-C30 heteroaryl group), a C1-C30 hydroxyalkyl group, a C2-C30 heteroaryl group containing nitrogen or oxygen, halogen, a nitro group, a cyano group, a C1-C30 alkyl group, a C1-C30 alkenyl group, a C1-C30 alkynyl group, a C1-C30 alkoxy group, a C1-C30 alkoxyalkyl group, a C6-C30 aryl group, a C6-C30 arylalkyl group, and a C5-C30 cycloalkyl group.

8. The organic semiconductor composition according to claim 1, wherein:

the aromatic ring compound corresponding to Formula I is selected from a group consisting of compounds corresponding to Formulas XVI and XVII:

Formula XVI

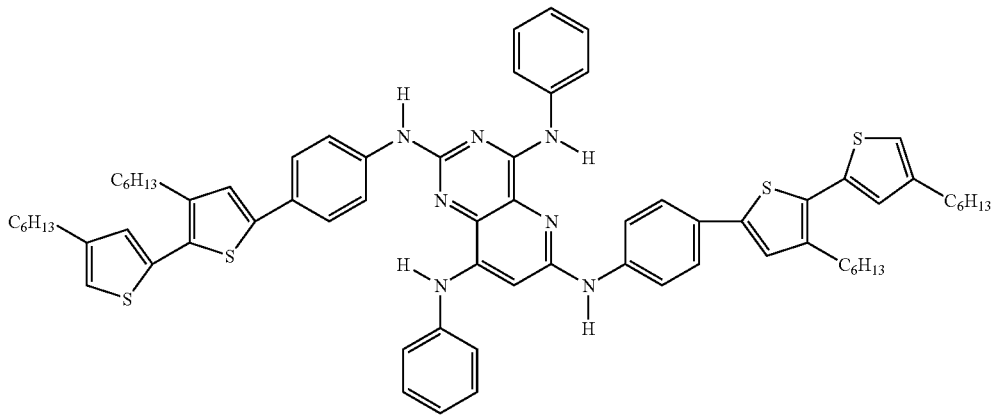

-continued

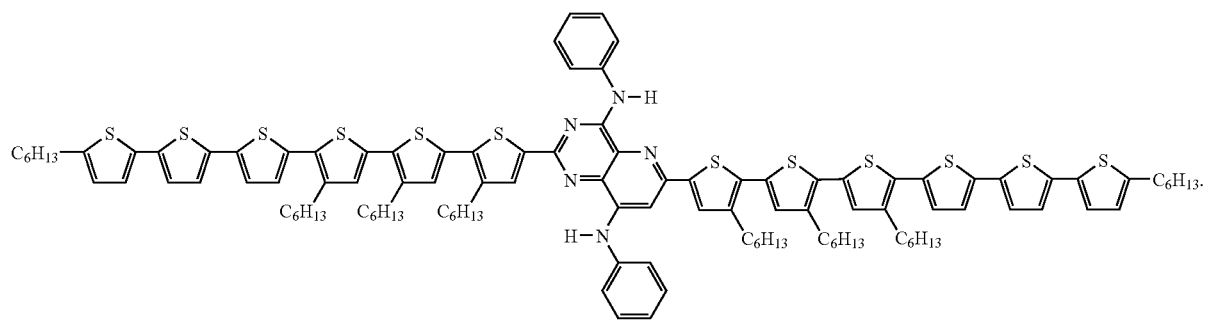

Formula XVII

9. The organic semiconductor composition according to claim 1, wherein:
   the aromatic ring compounds corresponding to Formula I have a weight average molecular weight (Mw) ranging from 100 to 10,000.

10. The organic semiconductor composition according to claim 1, wherein:
    the aromatic ring compound corresponding to Formula II is selected from a group consisting of compounds corresponding to Group III,

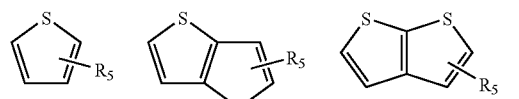
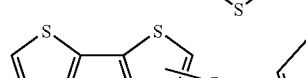
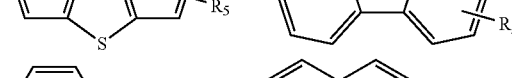
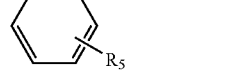
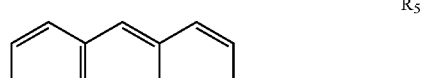
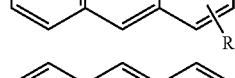
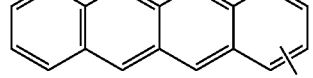
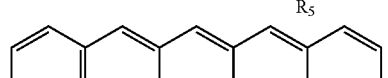
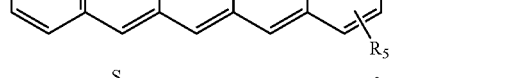
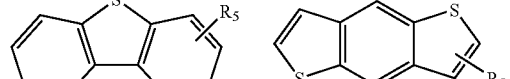
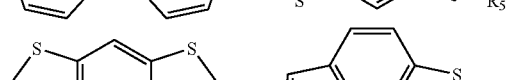
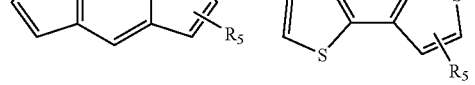

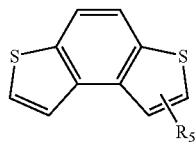
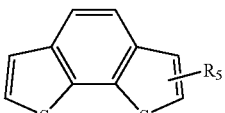
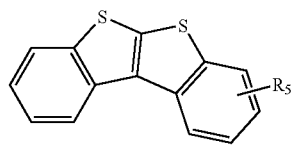
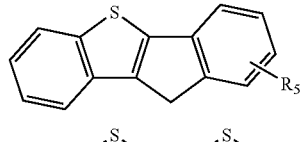
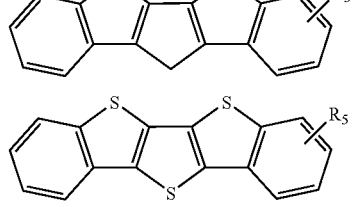
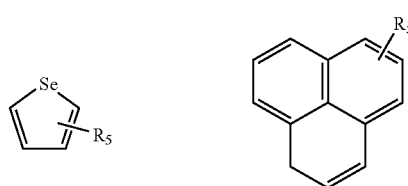
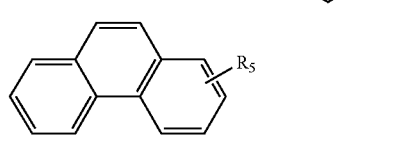
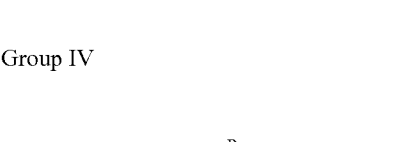

and Group IV

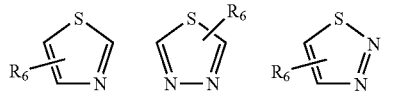
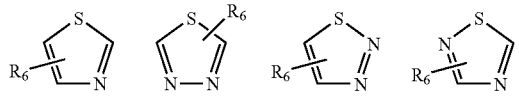

-continued

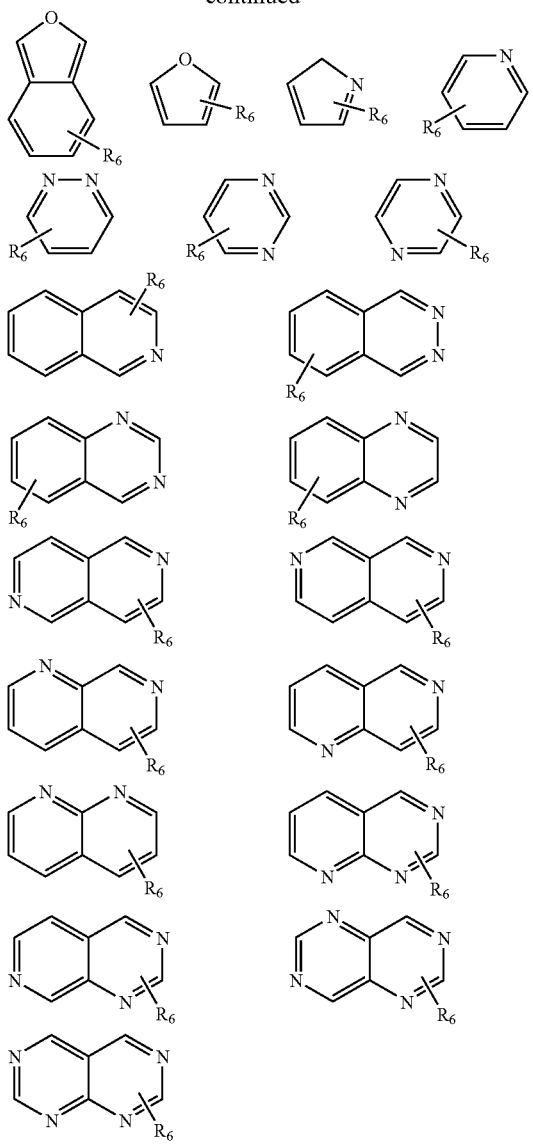

and mixtures thereof, wherein $R_5$ and $R_6$ are independently selected from a group consisting of —OH, —$NR_aR_b$, —$CONR_aR_b$, wherein $R_a$ and $R_b$, are each independently selected from a group consisting of hydrogen, C1-C30 alkyl groups, C6-C30 aryl groups and C2-C30 heteroaryl groups, —$COR_c$, wherein $R_c$ is selected from a group consisting of hydrogen, a hydroxyl group, halogens, C1-C30 alkyl groups, C6-C30 aryl groups and C2-C30 heteroaryl groups, and —$COOR_d$, wherein $R_d$ is selected from a group consisting of C1-C30 alkyl groups, C6-C30 aryl groups and C2-C30 heteroaryl groups, C1-C30 hydroxyalkyl groups, C2-C30 heteroaryl groups including at least one of nitrogen and oxygen as a heteroatom, halogens, a nitro group, a cyano group, C1-C30 alkyl groups, C1-C30 alkenyl groups, C1-C30 alkynyl groups, C1-C30 alkoxy groups, C1-C30 alkoxyalkyl groups, C6-C30 aryl groups, C6-C30 arylalkyl groups and C5-C30 cycloalkyl groups.

11. The organic semiconductor composition according to claim 1, wherein:
the aromatic ring compound corresponding to Formula II is selected from a group consisting of thiophene carboxylic acid, 2,5-thiophenedicarboxylic acid, benzoic acid, phthalic acid, naphthalic acid, naphthalene dicarboxylic acid, biphenyl-4,4'-dicarboxylic acid, 4'-hydroxy-4-biphenyldicarboxylic acid, benzylamine, thiophene carboxyl amide, thiophene ethyl amine, phenol, thiophene methanol, thiophene ethanol, 2,2'-bipyridine-4,4'-dicarboxylic acid and mixtures thereof.

12. The organic semiconductor composition according to claim 1, wherein:
the aromatic ring compound corresponding to Formula II has a weight average molecular weight (Mw) ranging from 50 to 10,000.

13. The organic semiconductor composition according to claim 1, wherein:
the second quantity of the second aromatic ring compound corresponding to Formula II in the composition corresponds to 0.001 to 1000 equivalents based on the first quantity of the first aromatic ring compound corresponding to Formula I.

14. The organic semiconductor composition according to claim 1, wherein:
the second quantity of the second aromatic ring compound corresponding to Formula II in the composition corresponds to 0.01 to 10 equivalents based on the first quantity of the first aromatic ring compound corresponding to Formula I.

15. The organic semiconductor composition according to claim 1, further comprising:
a quantity of an organic solvent sufficient to dissolve the first quantity of the first aromatic ring compound according to Formula I and the second quantity of the second aromatic ring compound according to Formula II.

16. The organic semiconductor composition according to claim 15, wherein:
the organic solvent includes at least one solvent selected from a group consisting of alcohols, methyl alcohol, ethyl alcohol, n-propyl alcohol, isopropyl alcohol, n-butyl alcohol, sec-butyl alcohol, t-butyl alcohol, isobutyl alcohol, diacetone alcohol, ketones, acetone, methylethylketone, methylisobutylketone, glycols, ethylene glycol, diethylene glycol, triethylene glycol, propylene glycol, butylene glycol, hexylene glycol, 1,3-propanediol, 1,4-butanediol, 1,2,4-butanetriol, 1,5-pentanediol, 1,2-hexanediol, 1,6-hexanediol, glycol ethers, ethylene glycol monomethyl ether, triethylene glycol monoethyl ether, glycol ether acetates, propyleneglycol monomethyl ether acetate (PGMEA), acetates, ethyl acetate, butoxyethoxy ethyl acetate, butyl carbitol acetate (BCA), dihydroterpineol acetate (DHTA), terpineols, tnmethyl pentanediol monoisobutyrate (TEXANOL), dichioroethene (DCE), chlorobenzene, N-methyl-2-pyrrolidone (NMP) and mixtures and combinations thereof.

17. A method of forming an organic semiconductor thin ifim comprising:
applying an organic semiconductor composition according to claim 15 to a substrate; and
evaporating substantially all of the solvent from the organic semiconductor composition, thereby forming an organic semiconductor thin film on the substrate.

18. A method of forming an organic electronic device, comprising:

forming a gate electrode;
forming a gate insulator;
forming source/drain electrodes;
applying an organic semiconductor composition according to claim 15; and
evaporating substantially all of the solvent from the organic semiconductor composition, thereby forming an organic semiconductor region between corresponding source/drain electrodes and adjacent the gate insulator.

19. An organic semiconductor composition, comprising:
a first aromatic ring compound according to Formula I;

$$(Ar_1)_a\text{—}(Ar_2)_b\text{—}(Ar_3)_c \qquad \text{Formula I}$$

wherein at least one hydrogen atom of at least one of $Ar_1$, $Ar_2$ and $Ar_3$ is replaced with a substituent selected from a group consisting of —OH, —$NR_aR_b$, —$CONR_aR_b$, wherein $R_a$ and $R_b$ are each independently selected from a group consisting of hydrogen, C1-C30 alkyl groups, C6-C30 aryl groups and a C2-C30 heteroaryl groups,
—$COR_c$, wherein $R_c$ is selected from a group consisting of hydrogen, a hydroxyl group, halogens, C1-C30 alkyl groups, C6-C30 aryl groups and C2-C30 heteroaryl groups,
—$COOR_d$, wherein $R_d$ is selected from a group consisting of C1-C30 alkyl groups, C6-C30 aryl groups and C2-C30 heteroaryl groups;
C1-C30 hydroxyalkyl groups and C2-C30 heteroaryl groups containing at least one of nitrogen and oxygen as a heteroatom;
wherein a, b and c are each independently selected from integers from 0 to 20 and satisfy the expression (a+b+c)>0; and
a second aromatic ring compound according to Formula II;

$$(Ar_4)_d\text{—}(Ar_5)_e \qquad \text{Formula II}$$

wherein $Ar_4$ and $Ar_5$ are each independently selected from a group consisting of substituted and unsubstituted C6-C30 aryl groups and substituted and unsubstituted C2-C30 heteroaryl groups, at least one hydrogen atoms thereof being substituted with a substituent containing an amino group or an hydroxyl group,
d and e are each independently selected from integers from 0 to 10 and satisfy the expression (d+e)≠0, and
the first aromatic ring compound according to Formula I and the second aromatic ring compound according to Formula II are joined by hydrogen bonds.

20. An organic semiconductor thin film comprising:
a first quantity of a first aromatic ring compound according to Formula I;

$$(Ar_1)_a\text{—}(Ar_2)_b\text{—}(Ar_3)_c \qquad \text{Formula I}$$

wherein $Ar_1$, $Ar_2$ and $Ar_3$ are each independently selected from a group consisting of substituted and unsubstituted C6-C30 aryl groups or substituted and unsubstituted C2-C30 heteroaryl groups, at least one ring carbon of at least one of $Ar_1$, $Ar_2$ and $Ar_3$ is substituted with nitrogen or oxygen, and a, b and c are each independently selected from integers from 0 to 20 and satisfy the expression (a+b+c)>0; and
a second quantity of a second aromatic ring compound according to Formula II;

$$(Ar_4)_d\text{—}(Ar_5)_e \qquad \text{Formula II}$$

wherein $Ar_4$ and $Ar_5$ are each independently selected from a group consisting of substituted and unsubstituted C6-C30 aryl groups and substituted and unsubstituted C2-C30 heteroaryl groups, at least one hydrogen atoms thereof being substituted with a substituent containing —NH or —OH, and
d and e are each independently selected from integers from 0 to 10 and satisfy the expression (d+e)≠0;
wherein a plurality of adjacent aromatic ring compounds are bonded through hydrogen bonds formed between a nitrogen or oxygen atom on a first adjacent aromatic ring compound and a second adjacent aromatic ring compound.

\* \* \* \* \*